(12) United States Patent
Brune et al.

(10) Patent No.: US 6,364,035 B2
(45) Date of Patent: Apr. 2, 2002

(54) ESTABLISHING POSITIONS OF LOCATING FIELD DETECTORS AND PATH MAPPING IN UNDERGROUND BORING TOOL APPLICATIONS

(75) Inventors: Guenter W. Brune; Peter H. Hambling, both of Bellevue; John E. Mercer, Kent; Lloyd A. Moore, Renton; Shiu S. Ng, Kirkland; Rudolf Zeller, Seattle, all of WA (US)

(73) Assignee: Digital Control Incorporated, Renton, WA (US)

( * ) Notice: Subject to any disclaimer, the term of this patent is extended or adjusted under 35 U.S.C. 154(b) by 0 days.

(21) Appl. No.: 09/845,238

(22) Filed: Apr. 30, 2001

Related U.S. Application Data

(63) Continuation of application No. 09/324,221, filed on Jun. 1, 1999, now Pat. No. 6,250,402, which is a continuation of application No. 08/835,834, filed on Apr. 16, 1997, now Pat. No. 6,035,951.

(51) Int. Cl.⁷ .............................................. E21B 47/024
(52) U.S. Cl. .......................... 175/45; 175/62; 175/202; 342/459; 342/463; 250/264
(58) Field of Search .............................. 175/40, 45, 57, 175/61, 62, 202; 342/450, 459, 463; 250/256, 264

(56) References Cited

U.S. PATENT DOCUMENTS

| | | | |
|---|---|---|---|
| 3,701,007 A | * 10/1972 | Schad | |
| 3,731,752 A | * 5/1973 | Schad | |
| 4,054,881 A | 10/1977 | Raab | |
| 4,314,251 A | 2/1982 | Raab | |
| 4,646,277 A | * 2/1987 | Bridges et al. | |
| 4,710,708 A | 12/1987 | Rorden et al. | |
| 4,806,869 A | * 2/1989 | Chau et al. | |
| 4,881,083 A | 11/1989 | Chau et al. | |
| 4,968,978 A | * 11/1990 | Stolarczyk | |
| 5,066,917 A | * 11/1991 | Stolarczyk | |
| 5,070,462 A | * 12/1991 | Chau | |
| 5,231,355 A | * 7/1993 | Rider et al. | |
| 5,337,002 A | 8/1994 | Mercer | |
| 5,585,726 A | * 12/1996 | Chau | |
| 5,633,589 A | 5/1997 | Mercer | |
| 5,698,981 A | * 12/1997 | Mercer | |
| 5,711,381 A | * 1/1998 | Archambeault et al. | |
| 6,035,951 A | * 3/2000 | Mercer et al. | ................. 175/45 |

* cited by examiner

Primary Examiner—Roger Schoeppel
(74) Attorney, Agent, or Firm—Michael Pritzkau

(57) ABSTRACT

Specific apparatus and associated methods are described for use in establishing the positions of locating field detectors and for path mapping within a region for the purpose of tracking and/or guiding the movement of an underground boring tool. In one aspect, an improvement is provided forming part of an arrangement for tracking the position and/or guiding the boring tool using an electromagnetic locating signal which is transmitted from the boring tool as the boring tool moves through the ground. At least two detectors are located at fixed positions within the region, each being operable in a transmit mode and in a receive mode such that each one of the detectors in the transmit mode is able to transmit a relative locating signal to the other detector for use in determining the relative position of one detector in relation to the other and such that both detectors receive the electromagnetic locating signal in the receive mode for use in determining the position of the boring tool within the region. Provisions are also described for extending drilling range by using additional detectors by moving a limited number of detectors. In another aspect, a system is provided including at least two above ground detectors for sensing the locating signal. The detectors are located at initial positions in the region. Electromagnetic data is generated by the detectors with the boring tool at multiple positions to generate electromagnetic data which is used to identify the positions of the detectors. A selected flux pathline steering technique is introduced.

24 Claims, 9 Drawing Sheets

ESTABLISHING POSITIONS OF LOCATING FIELD DETECTORS AND PATH MAPPING IN UNDERGROUND BORING TOOL APPLICATIONS

RELATED APPLICATION

This is a continuation application of prior application Ser. No. 09/324,221, filed on Jun. 1, 1999, now U.S. Pat. No. 6,250,402 which is a Continuation-in-Part of prior application Ser. No. 08/835,834 filed on Apr. 16, 1997 and issued as U.S. Pat. No. 6,035,951 on Mar. 14, 2000, designated the United States, the disclosures of which are incorporated herein by reference.

BACKGROUND OF THE INVENTION

The present invention relates generally to horizontal boring tool applications and, more particularly, to systems, arrangements and methods for establishing positions of locating field detectors and for path mapping within a region for the purpose of tracking the position of and/or guiding an underground boring tool which emits a locating field as it later progresses through the region during drilling operations. A selected flux pathline steering technique is also introduced.

It should be appreciated that prior art systems for use in locating an underground boring tool primarily employ walkover locator arrangements as disclosed, for example, in U.S. Pat. No. 5,337,002 which is assigned commonly with the present application. Inasmuch as Applicant is unaware of any prior art systems utilizing locating field detectors in the manner described in the parent of the instant application, the present application represents an advance which is particularly well suited for use with the systems and arrangements disclosed in the parent case. While the detector locating techniques disclosed in the parent case remain effective, the arrangements and method disclosed below are remarkably convenient and highly effective for their intended purpose, as will be seen.

SUMMARY OF THE INVENTION

As will be described in more detail hereinafter, there are disclosed herein arrangements, specific apparatus and associated methods for use in establishing the positions of locating field detectors and for path mapping within a region for the purpose of tracking and/or guiding the movement of an underground boring tool.

In one aspect of the invention, an improvement is provided forming part of an arrangement for tracking the position and/or guiding the boring tool using an electromagnetic locating signal which is transmitted from the boring tool as the boring tool moves through the ground, the improvement comprising at least two detectors located at fixed positions within the region, each being operable in a transmit mode and in a receive mode such that each one of the detectors in the transmit mode is able to transmit a relative locating signal to the other detector for use in determining the relative position of one detector in relation to the other and such that both detectors receive the electromagnetic locating signal in the receive mode for use in determining the position of the boring tool within the region.

In another aspect of the invention, at least two detectors initially receive the electromagnetic locating signal with the boring tool at a first position to produce a first subset of electromagnetic data and then the detectors receive the electromagnetic locating signal with the boring tool at a second position to produce a second subset of electromagnetic data. Thereafter, processing means combines the first and second subsets of electromagnetic data to produce an overall set of electromagnetic data for use, along with the established relative position between the detectors in determining the absolute positions of the detectors in the region.

In still another aspect of the present invention, the detectors are able to receive the electromagnetic locating signal in the receive mode within a dipole range from the boring tool and are able to receive the relative locating signal within a relative range from a detector that is in the transmit mode. Additional detectors may be provided for purposes including extending drilling range or further improving system accuracy. Accordingly, at least one additional detector is positioned in the region such that the additional detector may be out of the dipole range from the boring tool, but within the relative range of at least a first specific one of the other detectors, the absolute position of which is known in the region such that, with one of either the first specific detector or the additional detector in transmit mode and the other one of either the additional detector or the first specific detector receiving the relative locating signal, the relative position of the additional detector is determinable in relation to the known position of the first specific detector so that, in conjunction with the known position of the first specific detector, the absolute position of the additional receiver is established within the region.

In yet another aspect of the present invention, a system is provided including at least two above ground detectors for sensing the locating signal transmitted from the boring tool as part of an above ground arrangement, each of the detectors is configured for receiving the locating signal. The detectors are located at initial positions in the region within a dipole range of the electromagnetic locating signal transmitted from the boring tool at a first, start position. The locating signal is received by the detectors with the boring tool first at its start position to produce a first set of electromagnetic data. The boring tool is then moved to a second position. The electromagnetic locating signal is again received using the detectors with the boring tool at its second position to produce a second set of electromagnetic data. Absolute positions of the detectors within the region are then determined using certain information including the first and second sets of electromagnetic data in a predetermined way. In accordance with one feature of the present invention, one or more additional subsets of electromagnetic data may be produced at one or more additional positions of the boring tool. The additional subsets of electromagnetic data are then used in determining the absolute positions of the detectors as part of the overall electromagnetic data. Each additional position of the boring tool shifts the balance from unknown values to known values by at least one value. Accordingly, given a sufficient number of additional positions of the boring tool, the absolute positions of the detectors may be determined based solely on electromagnetic data.

In accordance with the aspect of the invention immediately above, the drilling range of the system may be extended by moving the detectors to new positions beyond their initial positions within the region. Electromagnetic data is generated with the boring tool at some subsequent position which may be known since the boring tool may be tracked up to this subsequent position with the detectors at their initial locations. The boring tool may then be moved to an additional subsequent position to generate further electromagnetic data. The electromagnetic data gathered at these subsequent positions of the boring tool may then be used in determining the new positions of the detectors such that tracking and/or guiding of the boring tool may then be performed in an area which is out of range of the detectors at their initial positions.

In accordance with another feature of the present invention a mapping tool is provided as part of the system for tracking the position and/or guiding a boring tool in the ground as the boring tool moves along an underground path which lies within a region. At least two above ground detectors are provided, each detector being configured for receiving the electromagnetic locating signal. With the boring tool at a start position, the above ground detectors are located at initial fixed positions within dipole range of the boring tool in an initial portion of the region for receiving the electromagnetic locating signal as the boring tool is later guided along an initial segment of the intended path within the dipole range of the boring tool. Without moving the boring tool from its start position, absolute positions of the detectors are determined within the initial portion of the region. Thereafter, the initial segment of the intended path is mapped through the initial portion of the region in a particular way using the detectors. Mapping/drilling range may be extended by moving the detectors in a predetermined way to new locations within an adjacent, new portion of the region including an adjacent, new segment of the intended path and establishing absolute positions of the detectors within the adjacent portion of the region. Thereafter, without moving the boring tool from its start position, the new segment of the intended path may be mapped in essentially the same manner as the initial segment through the new portion of the region through which the boring tool will later pass after having passed through the initial portion of the region. Mapping may be further extended by repeatedly locating the detectors in additional adjacent portions of the region and mapping the intended path through segments in these additional adjacent portions. Alternatively, each segment along the intended path may be mapped immediately prior to drilling. That is, each segment is mapped and drilled prior to mapping and drilling of the next segment along the intended path.

In one configuration, advantages of the present invention are provided in a system including a transceiver detector located at one fixed position within the drilling region. The transceiver detector is configured for transmitting a relative locating signal in a setup mode and for receiving the electromagnetic locating signal from the boring tool in a tracking mode for use in establishing the position of the boring tool. At least one receiver detector is provided at another fixed position within the region. The receiver detector is configured for receiving the relative locating signal in the setup mode such that the position of the receiver detector can be established relative to the position of the transceiver detector based on the relative locating signal and for receiving the electromagnetic locating signal in the tracking mode for use in establishing the position of the boring tool concurrent with a drilling operation.

In an additional aspect of the present invention, one above ground detector is provided configured for receiving the locating signal at a location within a dipole range of the locating signal transmitted from the boring tool at a first, start position. Before moving the boring tool to a second position, the locating signal is received at the first position to produce a first set of electromagnetic data. A second set of electromagnetic data is then produced with the boring tool at the second position. The absolute positions of the detector and the boring tool within the region are determined using certain information including the first and second sets of electromagnetic data in a predetermined way. In one feature, the distance between the first and second positions is measured and used as at least part of the certain information.

In a further aspect of the present invention, an improvement is provided for steering the boring tool using an electromagnetic locating signal which is transmitted from the boring tool as the boring tool moves through the ground. The improvement includes establishing a target location towards which the boring tool is to be steered and, thereafter, selecting a flux pathline extending between the boring tool and the target location such that a constant flux ratio between a vertical component of the locating field in a vertical direction and a horizontal component of the locating field in a horizontal direction is present along the selected flux pathline. The boring tool is then guided along the selected flux pathline to the target location.

BRIEF DESCRIPTION OF THE DRAWINGS

The present invention may be understood by reference to the following detailed description taken in conjunction with the drawings briefly described below.

DETAILED DESCRIPTION OF THE INVENTION

Figure 1:
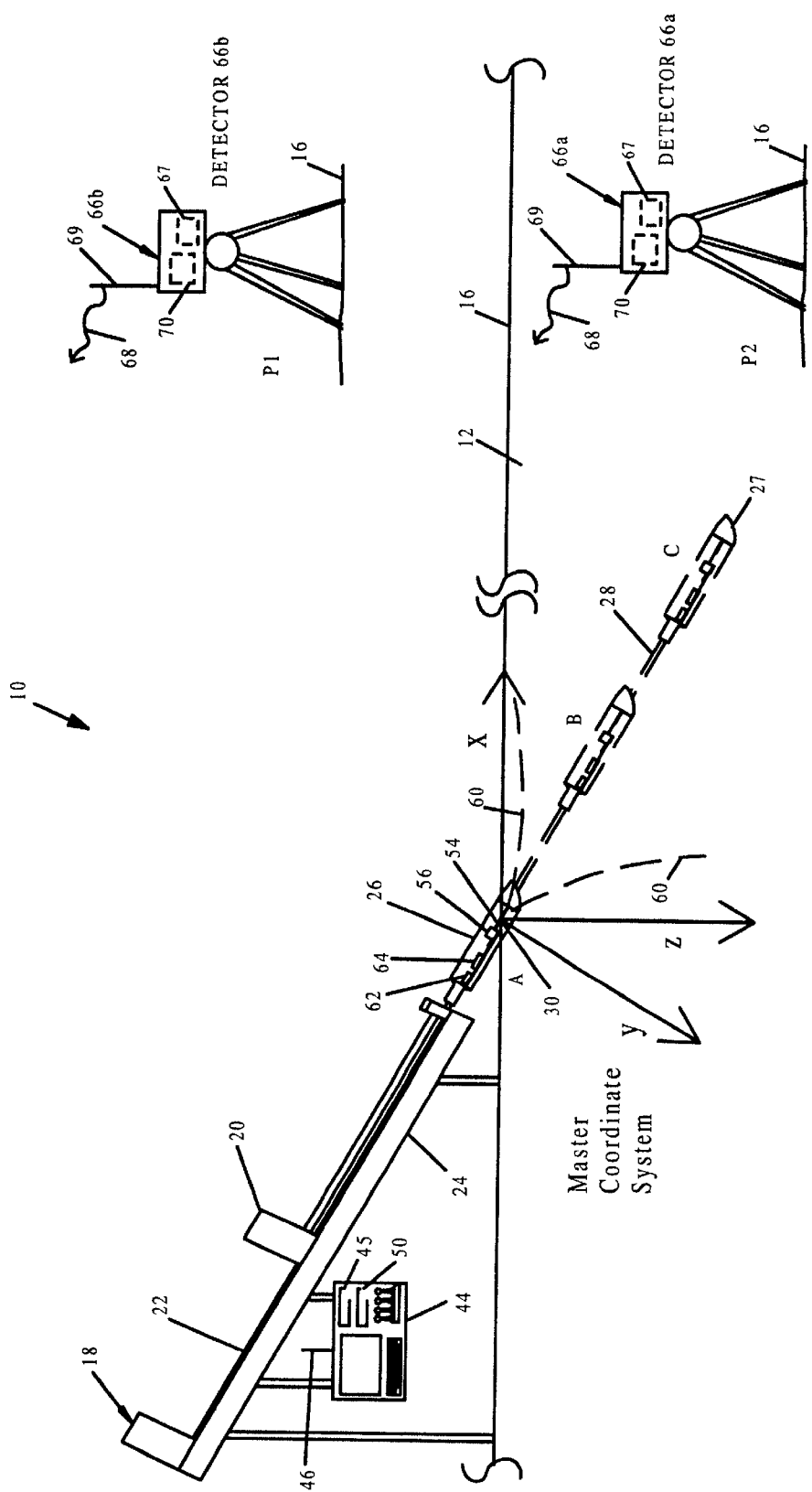
FIG. 1 is a diagrammatic elevational view of a horizontal boring operation being performed in a region using one horizontal boring tool system manufactured in accordance with the present invention.

Attention is immediately directed to FIG. 1 which illustrates a horizontal boring operation being performed using a boring/drilling system which is manufactured in accordance with the present invention and generally indicated by the reference numeral 10. The drilling operation is performed in a region of ground 12. The surface of the ground is indicated by reference numeral 16. It is to be understood that the surface of the ground is shown as being substantially planar for illustrative purposes only and that the surface may include significant relief features.

System 10 includes a drill rig 18 having a carriage 20 received for movement along the length of an opposing pair of rails 22 which are, in turn, mounted on a frame 24. A conventional arrangement (not shown) is provided for moving carriage 20 along rails 22. A boring tool 26 includes an asymmetric face 27 and is attached to a drill string 28. It is to be understood that the relative dimensions have been exaggerated as necessary in the figures for illustrative purposes. The boring tool is indicated at an initial, start point A and shown subsequently at calibration points B and C for reasons to be described. The present example contemplates movement of the boring tool within a global xyz coordinate system. For purposes of simplicity, in the present example, the x axis is coextensive with the ground and lies generally along an intended path of the boring tool, however, any other orientation at point A may be adopted within the constraints to be described. The origin of the global coordinate system is specified by reference numeral 30 essentially at the point where the boring tool enters the ground. While a Cartesian coordinate system is used as the basis for the global coordinate systems employed by the various embodiments of the present invention which are disclosed herein, it is to be understood that this terminology is used in the specification and claims for descriptive purposes and that any suitable coordinate system may be used. As noted, the x axis extends forward along the surface of the ground. The y axis extends to the right when facing in the forward direction along the x axis and the z axis is directed downwardly.

The drilling operation can be controlled by an operator (not shown) at a control console 44. It is noted that like reference numbers have been used to refer to like components wherever possible with regard to the parent of the present application. Therefore, further descriptions of console 44 and of other pertinent components will be limited herein since descriptions of these components may be found in the parent application. It should also be mentioned that dimensions in the various figures have been exaggerated for illustrative purposes. Several components of interest in console 44 include telemetry receiver or transceiver 45 associated telemetry antenna 46 and a processor 50.

Boring tool 26 includes a mono-axial antenna such as a dipole antenna 54 which is driven by a transmitter 56 so that a magnetic locating signal 60 is emanated from antenna 54. Orientation sensors (not shown) provide angular orientation measurement that may include, for example, roll, pitch and yaw of the drill head. A temperature sensor (not shown) and any other desired drilling parameter sensors (not shown) may also be included. Power may be supplied to transmitter 56 from a set of batteries 62 via a power supply 64. For descriptive purposes, the boring tool locating signal apparatus may be referred to as a transmitter. In accordance with the present invention, first and second detectors 66a and 66b are positioned within the global coordinate system for receiving locating signal 60 at positions P1 and P2, respectively. Detectors 66 are configured for measuring components of magnetic locating signal 60 along three receiving axes that may be orthogonal with respect to one another. For descriptive purposes, the axes will be assumed to be orthogonal and are referred to herein as $x_r$, $y_r$ and $z_r$ (not shown) defined within each detector. The receiving axes of each detector may be defined by an antenna structure 67 such as, for example, the highly advantageous structure disclosed in copending U.S. application Ser. No. 08/968, 636, which is incorporated herein by reference. It should also be noted that the antenna cluster receiving axes are not necessarily aligned with the x, y and z axes of the global coordinate system. Magnetic information measured along the receiving axes of either detector may be transmitted to operator console 44 in the form of a telemetry signal 68 which is transmitted from a telemetry antenna 69 and associated telemetry transceiver 70. Alternatively, the operator console may be connected with the detectors using cabling (not shown). Telemetry signal 68 is picked up at the drill rig using telemetry antenna 46 and telemetry transceiver 45. Thereafter, the telemetry information is provided to processor 50 such that the magnetic field information may be interpreted so as to determine the position of the boring tool in the global coordinate system or for use during the setup procedures contemplated herein, as will be described. Moreover, magnetic field information may be preprocessed using a local processor (not shown) located within each detector 66 in order to reduce the amount of information which is transmitted from the detectors to the operator console 44. Two-way communications between the detectors and the drill rig and also between the detectors (neither of which is shown) may be accomplished through the use of suitable telemetry transceivers. In this manner, data can be polled and the telemetry transceivers in the detectors may serve as repeaters.

Continuing to refer to FIG. 1, having generally described the components of system 10, it should be appreciated that the depicted layout comprises an initial drilling array. In this regard, the reader is reminded that the present invention is directed to establishing absolute positions/coordinates of all of the components which make up the array such that drilling may subsequently be performed. The absolute positions of the detectors and the boring tool may, of course, be established in a number of different ways in the prior art. For example, skilled personnel using surveying equipment may determine the absolute positions. However, by performing survey measurements in such a manner, a significant amount of time and money may be expended. Accordingly, the present invention introduces a number of system configurations and associated methods for establishing absolute positions of components of the drilling array which require little training or skill on behalf of an operator of system 10. In fact, the system may be configured such that the setup procedures are essentially automatic, transparent to the system operator and require minimal operator skill, as will be seen.

Still referring to FIG. 1, the overall combination of established, known absolute positions (i.e., those of the boring tool and at least two detectors) are required prior to drilling so as to enable effective tracking of the boring tool will be referred to as the "absolute configuration" of the drilling array hereinafter for purposes of convenience. A first setup procedure for establishing the drilling array absolute configuration begins with boring tool 26 at position A. As mentioned previously, the origin of the global coordinate system is assumed to be at the center of dipole antenna 56 which, of course, also identifies the center of the radiation pattern of locating field 60. With the boring tool at position A, locating signal 60 is transmitted from the boring tool for receipt by detectors 66. Each detector produces a set of electromagnetic data by measuring the received signal strength along each axis of the antenna array housed by the respective detector. Therefore, the two detectors each produce three known values for a total of six known electromagnetic values. In order to establish the absolute configuration of the drilling array, the problem must be well posed mathematically. That is, there must be at least as many conditional relations or equations, as unknown values. The latter may include (1) the transmitted strength of magnetic locating signal 60, (2) an initial yaw ($\beta_A$) of dipole antenna 54 in the global coordinate system (which is measured from the global x axis and is 0° in the present example, since dipole 54 is oriented along the x axis), (3) an initial pitch $\phi_A$ of dipole antenna 54, (4) the xyz location of detectors 66a and 66b within the global coordinate system, (5) the orientation angles (pitch, roll and yaw) of the receiving axes of the detectors relative to the global coordinate system and (6) the initial xyz location of the boring tool, for example, at origin 30 within the global coordinate system.

While a wide range of solutions may be formulated to deal with the foregoing list of unknown values, Applicants have made highly advantageous advances with regard to the systems and methods under discussion. It is initially noted that six known electromagnetic values are provided at position A or, for that matter, at any other position at which the boring tool is within range of the detectors. One of ordinary skill in the art might readily dismiss this observation as being of little worth since six unknown values (x, y and z of each detector and pitch, roll and yaw of each detector) are, at the same time, contributed by each detector. That is, the balance of unknown versus known values is not shifted by the detectors while values such as pitch of the boring tool and the signal strength of the locating signal remain unknown. The unknowns outweigh the knowns associated with one detector such that resolving the absolute configuration appears to be underdetermined and, thus, unsolvable as to absolute coordinates. However, the number of unknown values associated with the boring tool at a particular location bears further examination.

At each location of the boring tool in region 12, the associated unknown values are an xyz position, a pitch value and a yaw value. Because the magnetic field from the transmitter is symmetric, roll is not a variable in determining transmitter position. Thus, no more than five unknown values are contributed by the boring tool at any one position. Therefore, in accordance with the present invention, it is recognized that the number of unknown values in the overall problem of establishing the absolute configuration can be reduced by performing locating field measurements with the detectors at fixed locations and with the boring tool at multiple locations since each location of the boring tool contributes no more than five unknowns while contributing six known electromagnetic values from measurements by the two detectors. Remarkably, each additional location of the boring tool shifts the balance from unknown values to known values by at least one for each additional position of the boring tool at which electromagnetic measurements are made by the detectors. For this reason, given a sufficient number of positions of the boring tool, the absolute configuration of the drilling array can be determined based solely on electromagnetic readings from the detectors. It should be appreciated that an implementation which relies solely on electromagnetic measurements represents one end of a spectrum of possible implementations which advantageously utilize the unknown/known balance shift disclosed above. Therefore, a number of specific implementations will be described below. The described implementations are intended only as examples and are not considered as limiting the scope of the invention as set forth in the claims.

Still referring to FIG. 1, in accordance with one implementation, it is desired to establish the absolute configuration of the initial drilling array by performing detector electromagnetic readings with the boring tool at start point A and then advancing the boring tool to point B. Table 1 lists unknown versus known values for this "two calibration position" implementation.

TABLE 1

KNOWN/UNKNOWN VALUES USING TWO BORING TOOL POSITIONS

| # of BT posns | Descriptions of Unknowns | # of unknowns | Descriptions of Knowns | # of knowns |
|---|---|---|---|---|
| 2 | Detector Unknowns | | Detector Knowns | |
| | xyz of Det 66a | 3 | Det 66a | |
| | R, P, κ of Det 66a | 3 | magnetic values at | 3 |
| | xyz of Det 66b | 3 | posn A | |
| | R, P, κ of Det 66b | 3 | magnetic values at | 3 |
| | BT Unknowns | | posn B | |
| | At Point A | | Det 66b | |
| | dipole signal strength | 1 | magnetic values at | 3 |
| | P of BT | 1 | posn A | |
| | At Point B | | magnetic values at | 3 |
| | xyz of BT | 3 | posn B | |
| | P & Y of BT | 3 | TOTAL KNOWNS = | 12 |
| | TOTAL UNKNOWNS = | 19 | | |

Notes:
BT = Boring Tool;
R = Roll;
P = Pitch;
Y = yaw of BT;
κ = yaw of detector;
Det = Detector The overall number of unknowns is 19 while the overall number of known values is only 12. It should be noted that the number of unknowns with the boring tool at point A is reduced by assuming that the origin of the global coordinate system is at the center of dipole 54 and that the initial direction of the boring tool and dipole defines the direction of the x axis along the surface of the ground. As mentioned, the x axis is assumed to be in the plane of the surface of the ground for purposes of simplicity. Other, equally effective assumptions can be made, as one of ordinary skill in the art will appreciate in view of this disclosure. It is apparent that a well posed mathematical problem cannot be formulated based only on electromagnetic readings of the locating field using the boring tool at only two initial calibration positions. Therefore, the deficit of 7 known values must be supplied by other measurements or by other assumptions. Fortunately, certain information may readily be measured with sufficient accuracy to eliminate various unknowns. As a first example, the drill rig may include an arrangement (not shown) for measuring extension and/or retraction of drill string 28. If the extension of the drill string is measured from point A to point B and this distance is assumed to be a straight path, three position equations can be derived for point B representing three known values to increase the number of known values to 15. Four additional unknown values may readily be eliminated by direct measurement comprising the tilt orientation of the detectors. That is, deviation of the $x_d$ and $y_d$ axes of each detector from the horizontal direction. With the addition of two tilt measurements per detector, there are 15 known values and 15 unknown values, making the solution determined such that the absolute configuration of the drilling array can be established. It is emphasized that the present example represents only one of many possible implementations for eliminating the required number of unknown values. For example, as an alternative, to tilt sensors, the detectors may simply be leveled. Moreover, additional measured values can be used in order to formulate a least square error solution in which the number of known values is greater than the number of unknown values so as to improve the overall accuracy in determining the absolute configuration of the drilling array. For example, boring tool 26 may incorporate a pitch sensor so as to convert the pitch of the boring tool from an unknown to a known value. Another value that can be eliminated from the list of unknowns is dipole strength of the transmitter. Its value may readily be determined in a separate, above ground calibration procedure prior to drilling. The calibration procedure involves placing the transmitter in the boring head at a known positional relationship to one of the detectors and measuring the signal strength. The particular choice in determining the absolute configuration depends on required speed and accuracy, on the performance of processor 50 and also on the personal preference of the developer.

With reference now to Table 2 and FIG. 1, in accordance with another implementation, it is desired to establish the absolute configuration of the initial drilling array by performing detector electromagnetic readings with the boring tool located at three initial/calibration points. That is, at point C in addition to points A and B. Table 2 lists unknown versus known values for this three calibration position implementation.

TABLE 2

KNOWNS/UNKNOWNS USING THREE BORING TOOL POSITIONS

| # of BT posns | Descriptions of Unknowns | # of unknowns | Descriptions of Knowns | # of knowns |
|---|---|---|---|---|
| 3 | Detector Unknowns | | Detector Knowns | |
| | xyz of Det 66a | 3 | Det 66a | |
| | R, P, κ of Det 66a | 3 | magnetic values at posn A | 3 |
| | xyz of Det 66b | 3 | magnetic values at posn B | 3 |
| | R, P, κ of Det 66b | 3 | magnetic values at posn C | 3 |
| | BT Unknowns | | | |
| | At Point A | | | |
| | dipole signal strength | 1 | posn C | |
| | P of BT | 1 | Det 66b | |
| | At Point B | | magnetic values at posn A | 3 |
| | xyz of BT | 3 | magnetic values at posn B | 3 |
| | P & Y of BT | 2 | | |
| | At Point C | | | |
| | xyz of BT | 3 | magnetic values at posn C | 3 |
| | P & Y of BT | 2 | | |
| | TOTAL UNKNOWNS = | 24 | TOTAL KNOWNS = | 18 |

Notes:
BT = Boring Tool;
R = Roll;
P = Pitch;
Y = yaw of BT;
κ = yaw of detector;
Det = Detector In this example, the overall number of unknown values is 24 while the overall number of known values is 18. It should be observed that the deficit in the number of known values as compared with known values is 6, as compared with the example of Table 1 in which a deficit of 7 unknown values is present. Therefore, as mentioned in the foregoing discussions, the number of known values is increased by at least one with each additional calibration point of the boring tool at which electromagnetic readings are taken. The assumptions made in the example above have also been adopted in this example whereby to eliminate unknowns. In particular, the origin of the global coordinate system is assumed as the center of dipole 54 and the initial direction of the boring tool (and, hence, dipole 54) define the direction of the x axis along the surface of the ground, with the x axis in the plane of the surface of the ground.

As in the example above, additional known values may be provided by certain information such as, for example, position equations based upon the measured extension of drill string 28. In this instance, three position equations may be provided for the boring tool at calibration point B and another three position equations may be provided for the boring tool at calibration point C for a total of six additional known values. With these six additional known values, the absolute configuration of the drilling array can be determined. As one alternative, tilt sensors could be added to detectors whereby to supply four known values and a pitch sensor could be added to the boring tool whereby to supply two known values (i.e., pitch at calibration point B and pitch at calibration point C) such that the tilt sensors in combination with the pitch sensors alone provide all six additional required known values. In still other alternatives, the various measured values, as described, may be combined with the electromagnetic known values to establish a least square error solution.

Having established the absolute configuration of the initial drilling array, the drilling operation may ensue wherein the boring tool is guided and/or tracked to some predetermined location which is within range of the detectors. That is, above a specified maximum range from the detectors, the latter will be unable to receive the locating signal transmitted from the boring tool. Several highly advantageous approaches may be utilized to extend the drilling range of the boring tool, as will be described immediately hereinafter.

Figure 2:
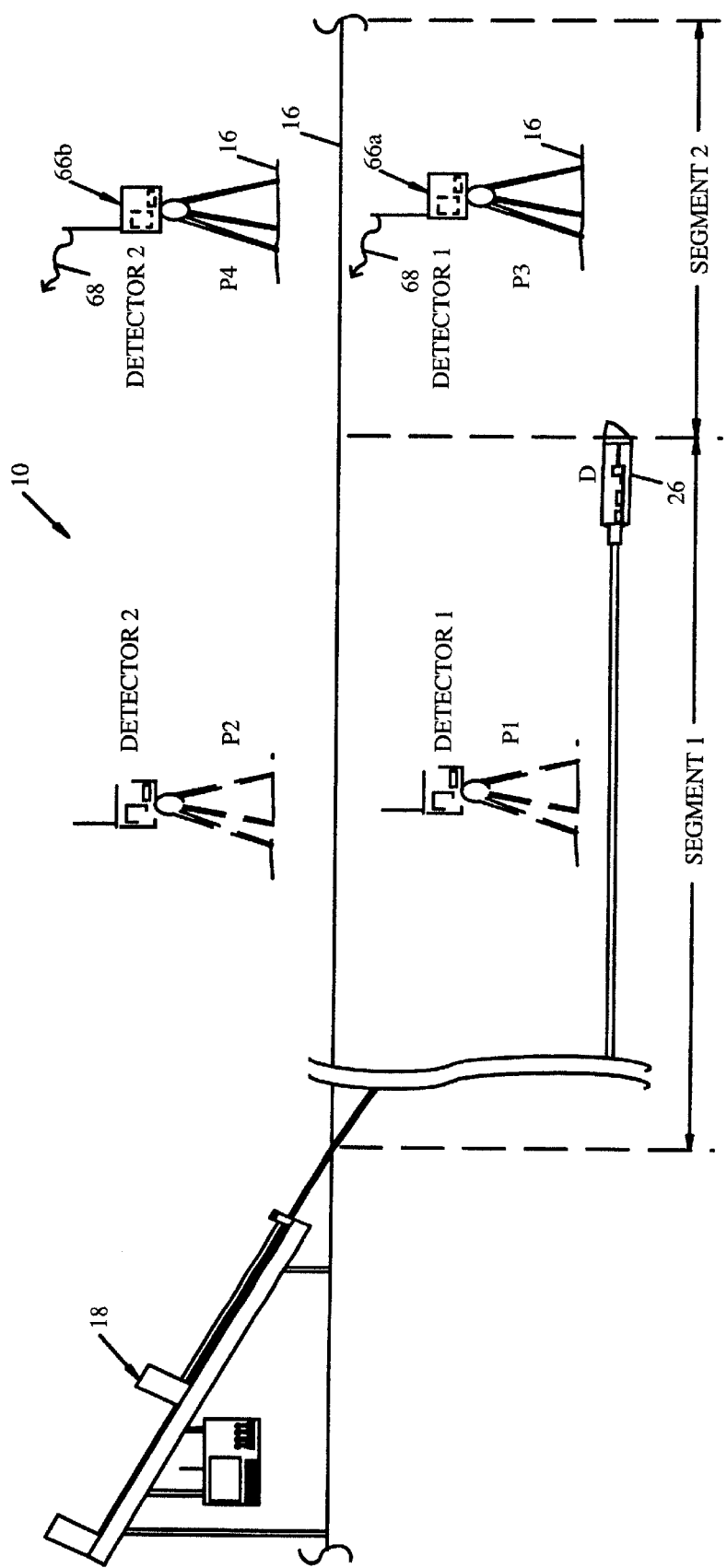
FIG. 2 is a diagrammatic elevational view of the system of FIG. 1 shown here to illustrate one procedure for performing extended range drilling in accordance with the present invention.

Turning now to FIG. 2, which also depicts system 10 and a proportionally larger area of region 12, boring tool 26 is shown after having advanced to a point D. The range over which the locating signal is receivable for the initial positions P1 and P2 of the detectors (shown in phantom at these positions) is denoted as segment 1, corresponding to a first portion of region 12. However, the boring tool is about to enter a second portion of region 12 corresponding to a second segment (i.e., segment 2) along the intended path of the boring tool. Within segment 2, the distance between the boring tool and either or both of detectors 66 exceeds the maximum range of the dipole signal for any position of the boring tool along the intended path of segment 2. Because the boring tool has been tracked during its advance by system 10, the absolute coordinates of point D are known. Moreover, the pitch and yaw of the boring tool are also known at point D. Therefore, prior to allowing the boring tool to advance along segment 2, detectors 1 and 2 are relocated to new positions, respectively, within the second portion of region 12.

As a practical matter, for long drill runs, the P3 and P4 positions should be just within range of the boring tool at position D whereby to maximize the length of segment 2. In this regard, the length of segment 1 should be maximized in the same manner when drilling initially from point A (FIG.

2). It should be appreciated that the configuration of the system with the detectors at positions P3 and P4 while the boring tool is at point D is, in essence, identical to the problem described above with determining the locations of the detectors in their initial positions, P1 and P2, since, in both instances, the location and orientation of the boring tool is known. Therefore, the procedures employed for the absolute configuration of the initial drilling array associated with segment 1, as described above, are applicable in the subsequent absolute configuration of the drilling array associated with segment 2. For this reason, these descriptions will not be repeated and the reader is referred to the foregoing discussions. It is to be understood that each time the boring tool is about to go out of range of the detectors, the procedure illustrated in FIG. 2 may be repeated such that drilling may proceed indefinitely based possibly, however, upon other constraints such as, for example, the range of telemetry signal 68 between the detectors and the drill rig. It should also be appreciated that the use of the "goal post" arrangement of detectors 1 and 2 is not required. Alternatively, for example, a "leap frog" arrangement (not shown) of the detectors may just as readily be used in which the detectors are arranged in a generally colinear manner along the intended path of the boring tool. Moreover, detectors may be positioned relative to a segment in a relatively random imprecise manner so long as they are within range of boring tool 26. Therefore, the requisite skill of an operator is minimal. As the transmitter moves beyond the range of one of the detectors, that detector could then be moved farther out. With three detectors, the transmitter could always be kept within range of two detectors while the third detector is being moved thereby avoiding the need to stop the drilling operation. To that end, the present invention contemplates a configuration in which processor 50 may determine and suggest, on the display at console 44 and/or on a portable unit to be described below, suitable locations for the detectors and when the detectors should be moved.

Figure 3:
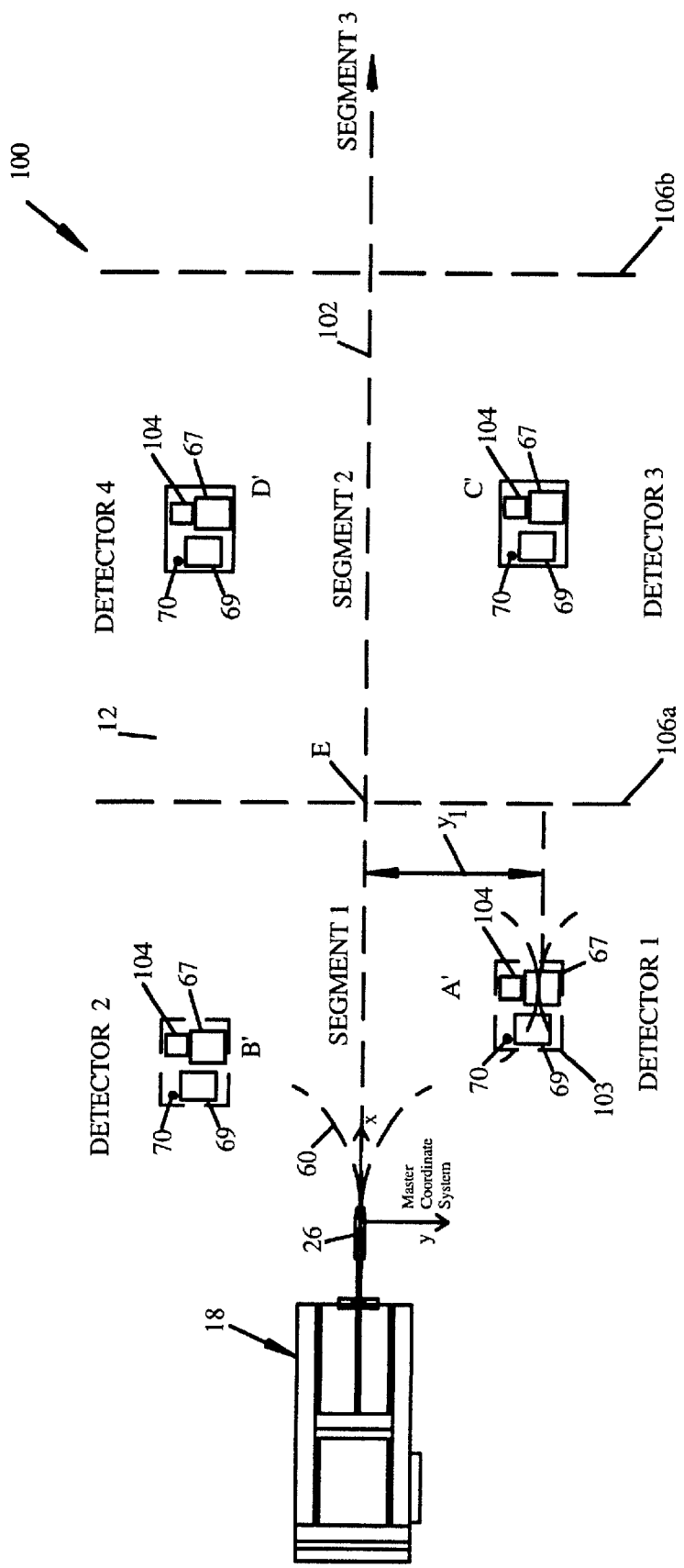
FIG. 3 is a diagrammatic plan view of a horizontal boring operation being performed in a region using another horizontal boring tool system manufactured in accordance with the present invention showing a four detector network of detectors which receive a locating signal from a boring tool.

Referring to FIG. 3 in conjunction with FIG. 2, the foregoing discussion describes one way in which a drilling operation may be performed over an extended distance. That is, a distance which is beyond the capabilities of the detectors to receive the locating signals with the detectors at positions within an initial drilling array. FIG. 3 illustrates another highly effective system and associated method for performing extended drill runs, generally indicated by the reference numeral 100. System 100 includes drill rig 18 positioned in region 12 for drilling along an intended path 102 using boring tool 26. Intended path 102 is shown as straight for illustrative purposes. It is to be understood that any intended path may be used in accordance with these teachings. Other components of system 100 include detectors 1–4. The latter are essentially identical to detectors 66, described above, with the exception of one additional function. Specifically, detectors 1–4 include the capability to transmit a relative locating or setup field 103 using antenna array 67, as shown being transmitted by detector 1. This capability is permitted through the addition of a transceiver block 104 connected to antenna array 67. Each detector may be placed into a setup transmit mode, for example, triggered by a telemetry signal received from console 44 for use in establishing the absolute configuration, to be described at an appropriate point below, or, as will be described immediately hereinafter, for determining the position of one detector relative to a detector at a known position.

When a detector is in the setup transmit mode, its transceiver block 104 causes antenna array 67 to transmit setup signal 103 which is characteristically a dipole field. In one embodiment, the relative locating signal is transmitted sequentially from each axis of antenna array 67. It should be noted that setup signal 103 is shown in FIG. 3 as being transmitted from the x axis of antenna array 67 in detector 1 (assuming that the axes of antenna array 67 are oriented in parallel to the corresponding axes of the global coordinate system, but this is not a requirement). For this example, it is assumed that the position coordinates and orientations of detectors 1 and 2 have already been established. With detector 1 in setup transmit mode, all other detectors are left in a receive mode such that they function in essentially the same manner as aforedescribed detectors 66. For purposes of extending the drilling range of the boring tool, it is generally advantageous to transmit in the setup mode the setup signal from the farthest detector from the boring tool having a known position. In this instance, it can be seen that detector I is slightly farther from the boring tool than detector 2.

Therefore, setup signal 103 is sequentially emanated from each of the x, y and z axes of antenna array 67 (with the x axis transmission being illustrated) of detector 1 for recording by detectors whose positions are to be determined such as detectors 3 and 4, in the present example. Assuming that a tilt sensor is present in each of the receiving detectors, four unknown variables for each unknown detector position will be determined including xyz position coordinates and detector yaw angle. Processing the three components of the magnetic field obtained, for example, from the x-component of the detector provides equations 1–3, below, for the distance between the transmitting detector and a receiving detector, in the global Cartesian coordinate system:

$$\Delta x = f_1(B_{xx}, B_{yx}, B_{zx}, \kappa_2) \tag{1}$$

$$\Delta y = f_2(B_{xx}, B_{yx}, B_{zx}, \kappa_2) \tag{2}$$

$$\Delta z = f_3(B_{xx}, B_{yx}, B_{zx}, \kappa_2) \tag{3}$$

Here, the functions $f_1$, $f_2$, $f_3$ may be derived by one having ordinary skill in the art from the equations of a magnetic dipole in three-dimensional space which are known in the art (see also, the parent of the present application, U.S. application Ser. No. 08/835,834 for additional details). The variable $\kappa_2$ denotes the yaw angle of the receiving detector and the magnetic field components measured by that detector are indicated as $B_{xx}$, $B_{yx}$ and $B_{zx}$. The first subscript of each of these components indicates the axis of antenna array 67 of the receiving detector being used while the second subscript (x) indicates that the measured field is transmitted by the x axis antenna of the transmitting detector. The total distance between the detectors is given by the expression:

$$D_x = \sqrt{(\Delta x)^2 + (\Delta y)^2 + (\Delta z)^2} \tag{4}$$

where $D_x$ indicates that the distance is determined based on transmission from the x axis of the transmitting detector.

An alternate method of calculating the total distance between detectors employs the complete set of detector field data. That is, nine values are measured by transmitting from each axis of antenna array 67 of one detector and receiving using each axis of antenna array 67 of another detector. Accordingly, an expression for the total distance is given as:

$$D = K\left[\frac{m}{B_T}\right]^{\frac{1}{3}} \quad (5)$$

where D is the total distance, K is a constant equal to the value $6^{1/6}$ or approximately 1.348 and $B_T$ is the magnitude of the total magnetic field, as defined below. The corresponding dipole strength of each of the transmitting antennas for antenna array 67 is denoted by the value m. It should be noted that m is assumed to be equal for transmission of setup signal 103 from all three axes common to antenna array 67 of the transmitting detector's transceiver. This assumption is accurate if the antennas are essentially identical and the antenna drive signals are identical. The total magnetic field, based on all nine measured magnetic values is:

$$B_T = \sqrt{B_{xx}^2 + B_{yx}^2 + B_{zx}^2 + B_{xy}^2 + B_{yy}^2 + B_{zy}^2 + B_{xz}^2 + B_{yz}^2 + B_{zz}^2} \quad (6)$$

where the subscripts of the nine magnetic values are designated in accordance with the description above. Hence, the total magnetic field induced at the receiving detector by all three transmitting antennas of in the transmitting detector is $B_T$. Note that $B_T$ is the magnitude of a vector sum since each transmitting antenna includes a different magnetic field.

An additional, fourth equation for the calculation of unknown detector coordinates and orientation is then obtained by requiring $D=D_x$. The computational problem is deterministic in the sense that the number of equations is the same as the number of unknowns, but the solution can formally be obtained employing any of the least square solution methods described in the prior art. Assuming detector 1 is transmitting and the position/yaw of detector 3 is to be determined, the translational position coordinates of detector 3 follow from:

$$x_3 = x_1 + \Delta x \quad (7)$$

$$y_3 = y_1 + \Delta y \quad (8)$$

$$z_3 = z_1 + \Delta z \quad (8)$$

where $x_1$, $y_1$ and $z_1$ are the known coordinates of detector 1 and $x_3$, $y_3$ and $z_3$ are the coordinates for detector 3. Note that the position increments $\Delta x$, $\Delta y$ and $\Delta z$ depend on detector yaw angle, $\kappa_2$. There only one particular value of $\kappa_2$ for detector 3 which will satisfy $D_x = D$, and this value, in general, must be determined by iteration.

In this regard, it should be appreciated that the use of the relative locating signal establishes only a relative position and orientation between the detector in setup transmit mode and each receiving detector. However, if the absolute position of either one of a pair of detectors in communication via the relative locating signal is known, the absolute position of the other detector can be determined based on the relative position information. As will be described hereinafter, the use of relative position information is highly advantageous, particularly with regard to providing for extended drill runs within the context of the overall operation of system 100.

Having generally described the components of detectors 1–4 of system 100 and the way in which setup signal 103 is used to establish the relative positions between detectors once the initial drilling array has already been established, a description of the operation of the overall system will now be provided. Initially, it is noted that intended path 102 is divided into segments 1–3 which are separated by vertically oriented dashed lines 106a and 106b. As in the preceding example, each segment represents a range on the intended path over which the detectors are capable of receiving locating signal 60 from boring tool 26. An initial drilling array is shown in segment 1, with boring tool 26 at the origin of the global coordinate system, as a first step in establishing the absolute configuration of the initial drilling array. Using detectors 1 and 2 in their receive mode, boring tool 26 transmits locating signal 60.

TABLE 3

KNOWNS/UNKNOWNS VALUES USING TRANSCEIVER CONFIGURATION WITH BORING TOOL AT A SINGLE INITIAL POSITIONS

| # of BT posns | Descriptions of Unknowns | # of unknowns | Descriptions of Knowns | # of knowns |
|---|---|---|---|---|
| 1 | Detector Unknowns | | Detector Knowns | |
| | x and z of Det 1 | 2 | Det 1 | |
| | κ of Det 1 (R and P measured) | 1 | magnetic values at posn A' | 3 |
| | xyz of Det 2 | 3 | y = y1, measured | |
| | κ of Det 2 | 1 | Det 2 | |
| | (R and P measured) BT Unknowns At Initial Position | | magnetic values at posn B' Relative Position Data | 3 |
| | dipole signal strength Y of BT (i.e., dipole 54) | 1 1 | Δx, Δy, and Δz | 3 |
| | TOTAL UNKNOWNS = | 9 | TOTAL KNOWNS = | 9 |

Notes:
BT = Boring Tool;
R = Roll;
P = Pitch;
Y = yaw of BT;
κ = yaw of detector;
Det = Detector Referring to Table 3 in conjunction with FIG. 3, the reader is reminded that six unknown values are typically associated with each detector (xyz coordinate location, pitch, roll, and yaw) for an initial total of twelve unknown values. By specifying measurements of certain information, as summarized in Table 3, the absolute configuration of the initial drilling array can be established (i.e., unknown values can be balanced with known values) with the boring tool at its initial location. In particular, pitch of the boring tool is measured by incorporating a pitch sensor (not shown) in the boring tool and tilt sensors (not shown) are included in the detectors such that the pitch sensor eliminates one unknown value while the tilt sensors, in combination, eliminate four unknown values. One other unknown is eliminated by measuring the distance of detector 1 from the x axis, indicated as y1. Alternatively, detector 1 may be positioned directly above the x axis (not shown) so that y1=0. Another unknown value comprises the signal strength of locating signal 60 It should be mentioned that signal strength may alternatively be eliminated as an unknown, for example, by following a separate calibration procedure, as described previously. A final unknown value is taken as the yaw of the boring tool at its initial position, A, since determination of the yaw of the dipole within the boring tool is generally difficult. Therefore, nine unknown values are present. By incorporating a magnetometer or other static magnetic field sensor (neither of which is shown) such as a giant magnetic resistor (GMR) in the boring tool, the yaw of the boring tool could be resolved in conjunction with the pitch and roll measurements, eliminating another unknown. The yaw measurement could also be used in other calculations such as the aforementioned calibration.

Still referring to Table 3 and FIG. 3, by receiving the locating signal, six known values are obtained, however, this leaves a deficit of three values (assuming no yaw measurement) with regard to establishing the absolute configuration of the initial drilling array. Therefore, relative position and orientation information is determined between detectors 1 and 2 by transmitting setup signal 103 from detector 1 to detector 2, as shown, or by transmitting from detector 2 to detector 1 (not shown). Consistent with the aforedescribed technique for establishing the relative positions between detectors, three additional known values are provided in the form of $\Delta x$, $\Delta y$ and $\Delta z$ equations. Therefore, in Table 3, nine overall unknown values are balanced by nine overall known values such that the absolute configuration of the initial drilling array associated with segment 1 is determinable.

Once the absolute configuration of the initial drilling array has been determined, drilling may proceed with the system tracking the progress of the boring tool along the intended path denoted as segment 1. However, either as drilling proceeds or prior to drilling, provisions may be made for drilling along segment 2 and segments thereafter. To that end, detectors 3 and 4 are positioned within the portion of region 12 associated with segment 2. Detectors 3 and 4 are configured essentially identically with detectors 1 and 2. Ideally, detectors 3 and 4 should be just within range of locating signal 60 as the boring tool passes from segment 1 to segment 2, and separated by a predetermined distance from one another in a direction that is generally perpendicular to the intended path whereby to maximize the length of segment 2 along the intended path of the boring tool. Even though the "goal post" arrangement is advantageous in extending system range, it should be appreciated that detectors 3 and 4 may be positioned almost anywhere (even within the portion of region 12 associated with segment 1) so long as they are at least initially within range of the boring tool as it passes to segment 2. Of course, the length of segment 2 will be influenced by any arrangement of detectors. In this regard, it is noted that some minimum spacing between the detectors should be observed in order to ensure tracking accuracy. This minimum separation is function of the range and positional accuracy required. Maximum segment length in a goal post configuration is approximately twice the maximum range of the locating signal. A "leap frog" arrangement of the detectors is also suitable, as described above. If a leap frog configuration is adopted, optimum range can be achieved by positioning the detectors at intervals along the intended drilling path that are spaced apart by the maximum useable range of locating signal 60. It is noted that a minimum signal to noise ratio can be used to determine maximum useable range.

Referring to FIG. 3, having established the absolute positions of detectors 1 and 2, the absolute positions of detectors 3 and 4 may be determined by establishing the position of these detectors relative to the known positions of either or both of detector 1 and/or detector 2 in accordance with the preceding description for determining detector relative positions, by sequentially transmitting (not shown) the relative locating signal, for example, from the three orthogonal axes of the antenna array of detector 3 and receiving the signal using the antenna array of detector 1, three position equations may be obtained. It should be appreciated, however, that with the inclusion of a tilt sensor in detector 3, four unknown values are present. These include the xyz position of detector 3 and its yaw. A fourth equation may be obtained by requiring $D=D_x$ (see equations 8 and 9). Therefore, the absolute position of detector 3 can be determined with the number of known values being equal to the number of unknown values. Additional known values can be obtained by also receiving the relative locating signal with detector 2. Thus, three additional position equations are available for a total number of six position equations. In this manner, a least square error solution can be employed for establishing the absolute position of detector 3. Thereafter, the absolute position of detector 4 can be determined by transmitting the relative locating signal to one or more of detectors 1–3 in a manner consistent with the foregoing descriptions. Note that it is equally effective to transmit the setup signal from any detector at a known position to detectors at unknown positions. For example, one or both of detectors 1 and 2 may transmit (sequentially, of course) the setup signals for purposes of determining the coordinates of detectors 3 and 4.

Continuing to refer to FIG. 3, it should be appreciated that the drilling range over which system 100 may track boring tool 100 can be extended substantially indefinitely by placing additional detectors relative to subsequent segments of the intended drilling path. For example, detectors 5 and 6 (not shown) may be positioned for tracking along segment 3 and their positions established using detectors 3 and 4. Thus, a network of detectors can be established to cover the entire intended drilling path. The drilling operation can then be performed in an uninterrupted manner, tracking the boring tool as it progresses along the entirety of the intended path. One limit as to the overall length of the intended path may reside in the maximum range of telemetry signal 68 from detectors farthest away from the drill rig. However, the telemetry range of present systems developed for directional drilling is already significant, on the order of one-half mile. Moreover, the telemetry range may be extended by suitable means such as, for example, by using the telemetry transceivers in the detectors to relay signals or to incorporate separate telemetry repeaters (not shown) into the system. Further advantages of system 100 will be brought to light in conjunction with the discussion of a highly advantageous feature to be described at an appropriate point below. It should be appreciated that in the instance where a number of detectors are at once distributed at unknown positions along some length of an intended path, the described method can be applied repeatedly, determining detector positions by moving farther and farther away from the drill rig as positions of detectors farther and farther from the drill rig are established, until the position coordinates and yaw angles of all detectors are known.

Referring to FIGS. 2–3, it should be appreciated that the teachings herein may be combined in an unlimited number of ways for purposes of overcoming an overall number of unknown values in a particular drilling/tracking scenario. For example, an alternative system may employ teachings from both systems disclosed above. That is, such an alternative system may readily be produced in which electromagnetic data is obtained by detectors which receive locating signal 60 from successive spaced apart positions of the boring tool in accordance with the technique described above with regard to system 10. This alternative system may, in combination with the features of system 10, utilize the detector transceiver feature of system 100 to establish relative positions between certain ones of the detector transceivers whereby to further eliminate unknown values. Therefore, this alternative system represents one of many possible systems which are considered to be within the scope of the present invention.

Figure 4:
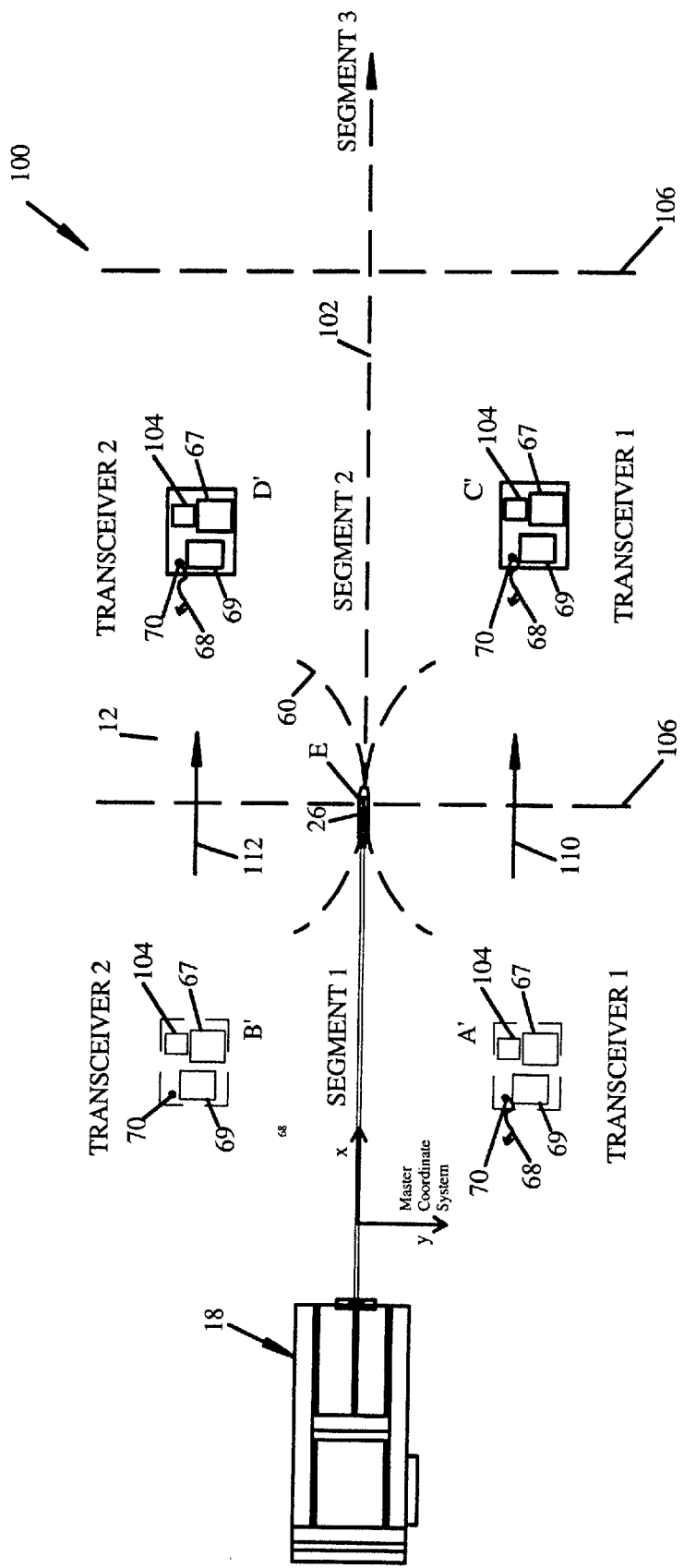
FIG. 4 is a diagrammatic plan view of the system of FIG. 3 shown here to illustrate the operation of the system using only two detectors.

Still discussing system 100 with reference now to FIG. 4, in one modification, the required number of detectors may be limited to two. This modification may significantly reduce the overall cost of the system while still permitting boring tool tracking over an extended drilling path. In a two detector configuration, after establishing the absolute configuration of the initial drilling array, drilling proceeds while tracking the boring tool to point E using detectors 1 and 2 at positions A' and B', respectively. At point E, the boring tool is within range (albeit, typically at its maximum range for locating signal 60) of positions A'–D'. Drilling stops at point E and either detector 1 or 2 is moved into the portion of region 12 associated with segment 2 in the directions indicated by arrows 110 and 112. For example, detector 1 is moved from position A' to position C' while detector 2 initially remains at position B'. It is important not to disturb detector 2 at position B', since its absolute coordinates and orientation are known there. With detector 1 at position C', the setup signal (not shown) may be transmitted between the two detectors in accordance with the foregoing descriptions to establish the absolute coordinates and orientation of detector 1 based upon the known position and orientation of detector 2. Thereafter, detector 2 is moved from position B' to position D'. Because the absolute coordinates and orientation of detector 1 are now known, the relative locating signal may once again be transmitted between the two detectors so as to establish the absolute coordinates and orientation of detector 2. Having thus established the absolute coordinates and orientations of both detectors within the portion of region 12 associated with segment 2, boring tool 26 may be tracked along segment 2 of intended path 102. Once the boring tool reaches segment 3, the detectors may be moved to the portion of region 12 associated with segment 3 and their positions established in the same manner. Therefore, the length of intended path 102 is not limited by the use of two detectors. As mentioned above, with regard to exceptionally long drill runs, the range of telemetry signal 68 to the drill may be extended through appropriate provisions.

Still referring to FIG. 4, in the interest of further reducing the cost of system 100 without significantly affecting its capabilities, it should be mentioned that the system may be configured with one detector transceiver unit and one detector receiver unit (not shown). That is, a detector receiver unit similar to detectors 66 used in system 10 may be used in place of one of the detector transceivers of the dual detector configuration of system 100. In using a detector receiver/transceiver configuration, the procedure described above may be used with the difference, of course, that the relative locating signal is always transmitted from the detector transceiver unit to the detector receiver unit. Even then, as drilling is advanced from one segment to the next, either one of the detector transceiver unit or detector receiver unit may first be moved to the portion of region 12 associated with segment 2, since the relative position (and, hence, the absolute coordinates and orientation of the moved unit) between the detector receiver unit and detector transceiver unit can be established in either instance by means of the relative locating signal.

Figure 5:
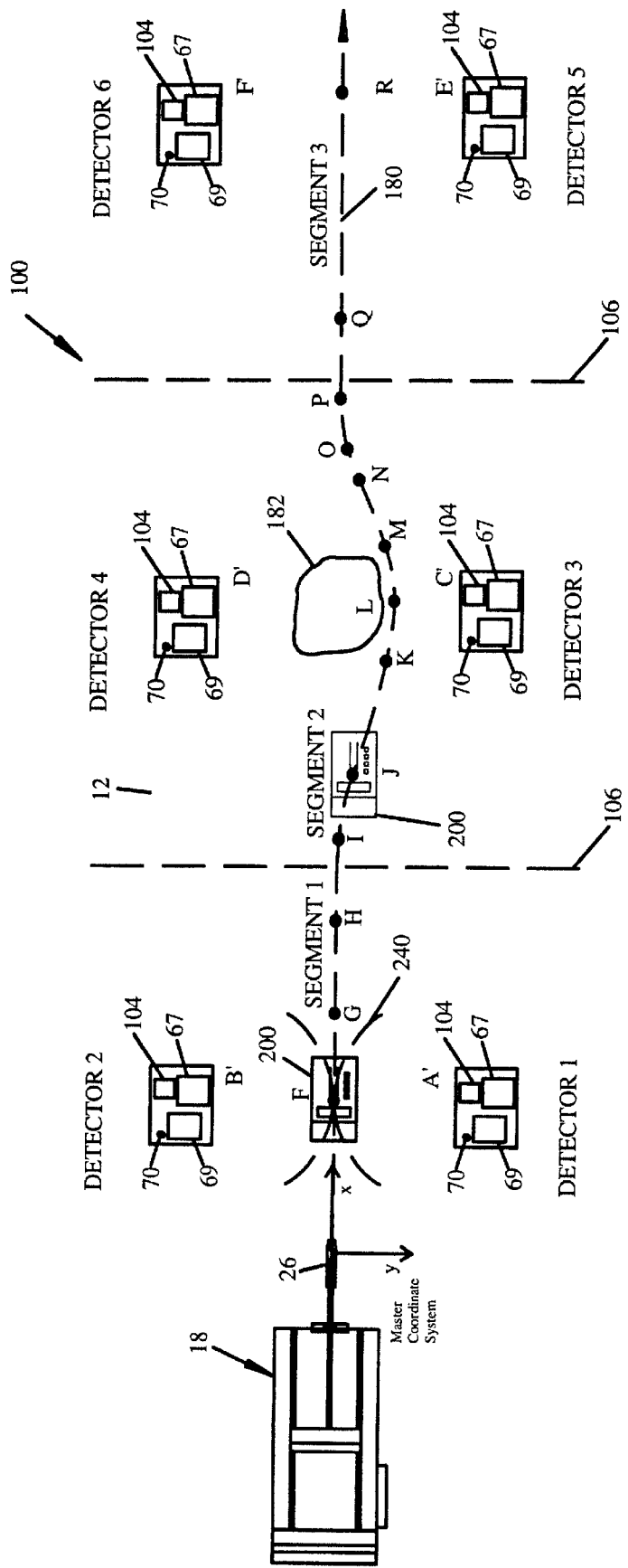
FIG. 5 is a diagrammatic plan view of the system of FIG. 3 with six detectors positioned along an intended path of the boring tool shown here to illustrate mapping the intended path using a highly advantageous mapping tool in accordance with the present invention.

Attention is now directed to FIG. 5 for purposes of discussion of a highly advantageous configuration and feature of previously described system 100. The reader is reminded that system 100 utilizes a "network" of detectors incorporating detectors such that the entire intended path of the boring tool can be tracked without the need for intermediate steps in which detectors are relocated along the intended path. The latter is indicated by the reference number 180 and differs from intended path 102 in FIG. 3 in the respect that segment 2 of path 180 is curved in a way which avoids an obstacle such as, for example, a large boulder 182. Detectors 5 and 6 have been included to illustrate coverage of the detector network all along the illustrated portion of intended path 180. The absolute coordinates and orientations of detectors 5 and 6 are readily established in accordance with the foregoing procedures. The manner in which intended path 180 is established will be described immediately hereinafter.

Figure 6:
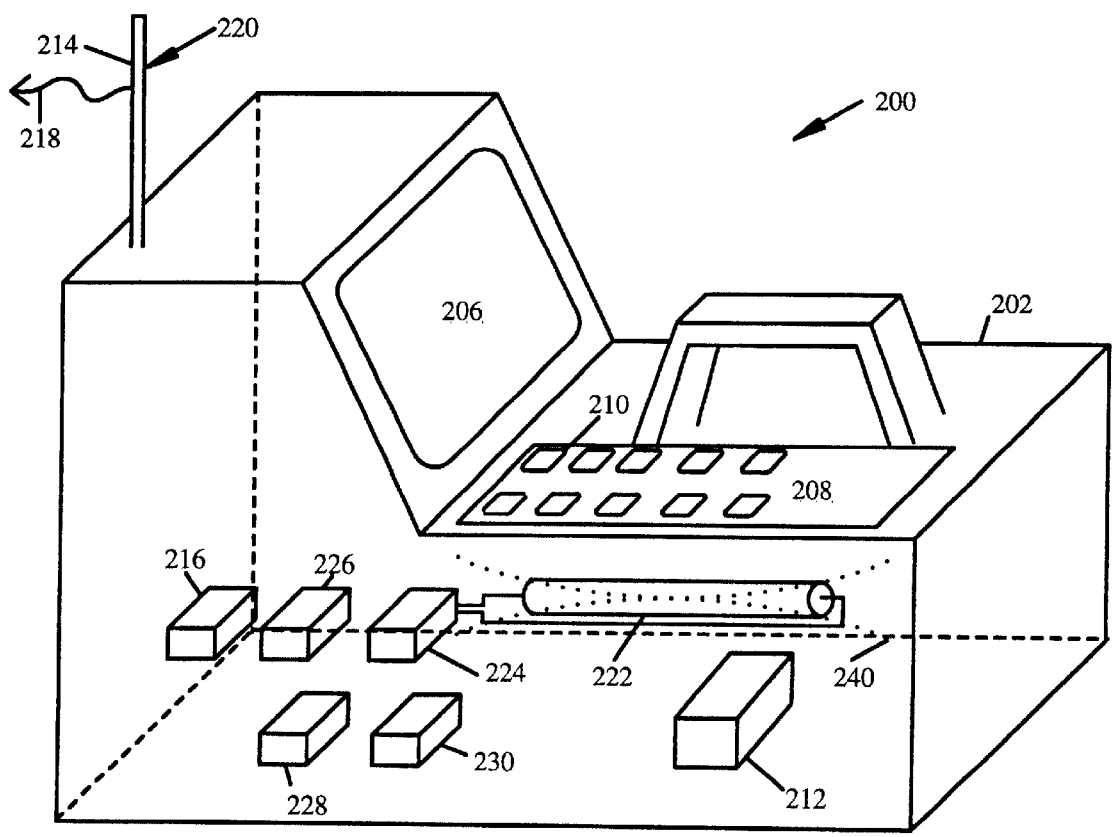
FIG. 6 is a diagrammatic, perspective view of the mapping tool shown in FIG. 5 shown here to illustrate details of the configuration of the mapping tool.

Turning to FIG. 6 in conjunction with FIG. 5, a mapping tool is generally indicated by the reference number 200. Mapping tool 200 is portable and includes a case 202 having a handle. A display panel 206 is positioned for ease of viewing and a keyboard panel 208 is provided having a series of buttons 210 for entry of necessary data. Power is provided by a battery 212. A telemetry antenna 214 is driven by a telemetry transmitter 216 for transmitting a telemetry setup signal 218 to operator console 44 and processor 50 (FIG. 2) therein. These telemetry components and associated signal make up a telemetry link 220. Further components of the mapping tool include a mapping dipole antenna 222 which is driven by a mapping signal generator 224. Other components may be included such as, for example, a magnetometer 226, a tilt sensor 228 and a processing section 230. Mapping dipole 222 is configured along with mapping signal generator so as to transmit a fixed, known strength mapping signal 240 having a characteristic dipole field which is measurable in the same manner as magnetic locating signal 60 (FIG. 2).

Still referring to FIGS. 5 and 6, attention is now directed to the way in which mapping tool 200 is used as part of system 100. It should be appreciated that mapping tool 200 may be located using setup signal 240 within region 12 in essentially the same manner as boring tool 26 is located using previously described locating field 60 With system 100 in a mapping mode initiated from console 44 and having established the detector network all along intended path 180, the entire intended path may be mapped by placing the mapping tool sequentially at a number of points, indicated as F through R, along the path. At each point, setup signal 240 is transmitted to detectors that are within range such that the absolute position of the mapping tool may be determined in region 12. For example, assuming the absolute configuration of the detector network has been determined, an operator (not shown) may initially position mapping tool 200 at point F. Thereafter, the operator may press one of buttons 210 on keypad 208 so as to initiate transmission of mapping signal 240. Detectors 1 and 2 then measure the strength of setup signal 240 from positions A' and B' and transmit this information by way of telemetry signal 68 to processor 50 in console 44 at the drill rig. Processor 50 then determines the absolute position of the mapping tool. In segment 2, the intended path is defined so as to steer around boulder 182. The mapping procedure is completed once a sufficient number of points have been identified along intended path 180. It is noted that the points need not be entered in the exact sequence that they are encountered along the intended path. That is, processor 50 may be used to construct the intended path, appropriately ordering the points and then displaying the intended path to an operator. It is mentioned that the mapping tool may be configured to be held above the ground as the setup signal is transmitted. In such a configuration, the mapping tool may measure the distance of its position above the ground, for example, as described in U.S. Pat. No. 5,155,442 which describes the use of such a configuration within a portable walk over locating unit. Moreover, an intended depth of the intended drilling path may be entered into the system such that processor 50 establishes appropriate z axis depths for the intended path as described, for example, in the parent of the present application, U.S. Ser. No. 08/835,834. In this way, the intended path may readily be modified (not shown), for example, to pass beneath or above an in-ground obstacle such as, for example, boulder 182. Alternatively, the grade of the intended path may be specified between points in absolute elevation rather than depth below the surface.

Referring again to FIG. 4, having described the use of mapping tool 200 in a six detector implementation of system 100, it should be appreciated that the mapping tool may be used in any configuration of detectors, having either receiver or transceiver capability, for purposes of establishing an intended path in part or in its entirety prior to drilling. That is, there is no requirement for a network of detectors which at once covers all of the segments along the intended path. For instance, the mapping tool may be used effectively in several different procedures with the dual detector implementation of system 10, as shown in FIG. 4. The mapping tool may be used in a first procedure, for example, by (1) mapping the intended path through a particular segment relative to which detectors 1 and 2 are positioned for tracking the boring tool, (2) advancing the boring tool along that particular segment to the next segment, (3) relocating the detectors relative to the next segment and then (4) advancing the boring tool through this next segment to still another segment. This procedure has the advantage that the detectors need be moved only once relative to a particular segment. The mapping tool may be used in a second procedure, for example, by mapping the intended path through a particular segment relative to detectors 1 and 2, as in the first procedure, but then relocating the detectors for tracking relative to the next segment without actually drilling through the first segment. This next segment is then mapped using the mapping tool. The detectors may then be relocated relative to still another segment which is then mapped, again prior to any drilling. Therefore, this second procedure may advantageously map the entire intended path using only two detectors (or, alternatively, one detector incorporating a receiver and one detector incorporating a transceiver, as described above with regard to a lower cost implementation) prior to drilling.

Referring to FIG. 6, it should be appreciated that information measured by mapping tool 200, for example, using magnetometer 226 or tilt sensor 228 may be used in least square error solutions so as to further improve overall accuracy of the mapped/intended path. The mapping tool may also be employed in other useful ways. For example, in order to reduce accumulated errors, the mapping tool may be positioned at a known location within region 12. Such a known position could be established, for example, based upon Global Positioning System (GPS) measurements or by a survey marker. The positions and orientations of detectors within range of the mapping tool may then be refined based on measurements of mapping signal 240, as transmitted from the known position. Thereafter, positions and orientations of all detectors (irrespective of whether each detector incorporates a transceiver or receiver) within a network may be refined based upon the refined locations of the detectors within range of the mapping tool. Alternatively, as opposed to using mapping tool 200 for this purpose, a detector may be placed at a known location for transmitting setup signal 103. The setup signal can then be measured by detectors incorporating transceivers or receivers within range of the transmitting detector at the known location for use in refining the positions of the receiving detectors in a similar manner. The mapping tool could also include antenna structure 67 (FIG. 1). That is, the same antenna structure as used in the detectors for transmitting and/or receiving purposes to improve positional accuracy, computational ease or in for use in conjunction with other advantageous procedures. The mapping tool may also serve as a locator for tracking the boring tool as described, for example, in U.S. Pat. No. 5,633,589 entitled Device and Method for Locating an Inground Object and a Housing forming Part of said Device, which is incorporated herein by reference.

Figure 7:
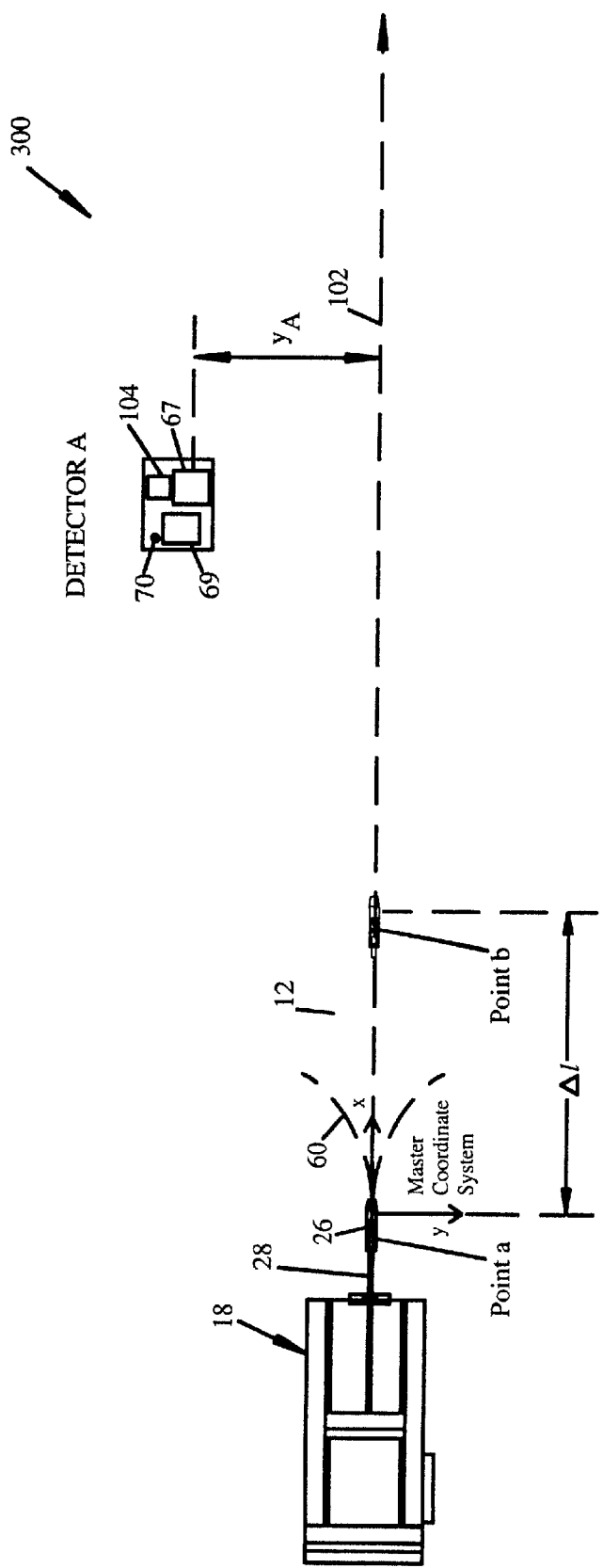
FIG. 7 is a diagrammatic plan view of a horizontal boring operation being performed in a region using still another horizontal boring tool system manufactured in accordance with the present invention showing a single fixed location above ground detector which receives a locating signal from a boring tool.

Attention is now directed to FIG. 7 which illustrates a horizontal boring operation being performed using another boring/drilling system which is manufactured in accordance with the present invention and generally indicated by the reference numeral 300. The drilling operation is again performed in region of ground 12.

System 300 includes drill rig 18 and boring tool 26 transmitting locating signal 60 Unlike previously described systems 10 and 100, however, system 300 includes only one detector indicated as "Detector A" for receiving locating signal 60 at a position denoted coordinates having the subscript "A". Detector A is configured in accordance with previously described detectors which at least include the capability to receive locating signal 60 along three orthogonally arranged axes using antenna arrangement 67. System 300 further includes an arrangement (not shown) for measuring extension of drill string 28 as described, for example, in the parent of the present application. The boring tool is indicated at an initial, start point a and shown subsequently at point b for reasons to be described. As above, the present example contemplates movement of the boring tool within a global xyz coordinate system. The x axis is coextensive with the ground and lies generally along intended path 102 of the boring tool, however, any other orientation at point a may be adopted within the constraints to be described. The origin of the global coordinate system is specified as being at point a. The y axis extends to the right when facing in the forward direction along the x axis and the z axis (not shown) is directed downwardly into the x,y plane of the figure. Therefore, detector A is offset from the x axis by a distance $y_A$. To avoid measuring $y_A$, the detector can be placed on the x-axis in which case $y_A$ becomes zero. In the present example, tilt angles of detector A are assumed to be measured or known from which pitch and roll angles of the detector are derived. For each of initial locations of the boring tool i.e., at points a and b, transmitter pitch $\phi$ is measured using a pitch sensor (not shown) in boring tool 26 and three orthogonal components of the magnetic flux at the detector are measured. As mentioned, the origin of the global coordinate system x, y, z is chosen to coincide with the location of the transmitter at point a such that $x_a=y_a=z_a=0$. Furthermore, the drill string increment, $\Delta l$, between the initial positions at points a and b is measured.

TABLE 4

KNOWN/UNKNOWN VALUES USING SINGLE DETECTOR AND TWO BORING TOOL POSITIONS

| # of BT posns | Descriptions of Unknowns | # of unknowns | Descriptions of Knowns | # of knowns |
|---|---|---|---|---|
| 2 | Detector A Unknowns | | Detector A Knowns | |
| | $x_A, z_A$ | 2 | magnetic values at pt a | 3 |
| | $\beta_A$ | 1 | | |
| | BT Unknowns | | magnetic values at pt b | 3 |
| | dipole signal strength At Point a | 1 | Known re BT | |
| | $\beta_a$ of BT At Point b | 1 | $\Delta l$ from point a to point b giving 3 position equations | 3 |
| | $x_b, y_b, z_b$ | 3 | | |
| | $\beta_b$ of BT | 1 | TOTAL KNOWNS = | 9 |
| | TOTAL UNKNOWNS = | 9 | | |

Notes:
BT = Boring Tool;
$\beta$ = Yaw of BT;
Det = Detector

Referring to Table 4 in conjunction with FIG. 7, five unknowns are associated with detector A ($x_A$ and $z_A$ coordinate locations and yaw) since $y_A$ and tilt are known. With regard to the boring tool, unknowns include yaw angles at points a and b, the transmitter dipole signal strength and the coordinates of point b ($x_b$, $y_b$ and $z_b$). Therefore, in this instance, nine unknowns must be determined in order to determine the absolute drilling configuration of system 300. It should be appreciated that other unknowns can be eliminated or additional known values or conditional relations may be introduced, as is the case with aforedescribed systems. For example, transmitter dipole strength could be determined in a separate calibration procedure prior to beginning drilling. Furthermore, detector A yaw angle could be eliminated from the list of unknowns by measuring its value using commercially available devices such as a magnetometer. In addition, all three position coordinates of detector A could be obtained using standard surveying equipment. Unknown variables are ultimately chosen based on accuracy requirements and ease of use of the locating system. Moreover, different solutions can be formulated based on desired accuracy. For example, a least square error approach can be adopted.

Continuing to refer to FIG. 7 and Table 4, nine equations can be formulated including: (i) three dipole equations for the magnetic flux intensities emitted from the transmitter in the boring tool at point a, as measured by detector A, (ii) three dipole equations for the magnetic flux intensities emitted from the transmitter in the boring tool at point b, as measured by detector A and (iii) three drill string positional equations for establishing the coordinates of point b in terms of global coordinates.

The dipole equations can be written as:

$$B_x = \frac{3x_t^2 - r^2}{r^5} \tag{10}$$

$$B_y = \frac{3x_t y_t}{r^5} \tag{11}$$

$$B_z = \frac{3x_t z_t}{r^5}, \quad \text{and} \tag{12}$$

$$r^2 = x_t^2 + y_t^2 + z_t^2 \tag{13}$$

where $x_t$, $y_t$, $z_t$ (not shown) indicate a three-dimensional coordinate system with its origin at the center of the boring tool dipole transmitter and having $x_t$ oriented in the direction of its dipole axis. In this instance, it is noted that $x_t$, $y_t$, $z_t$ coincide with the global coordinate system axis for purposes of clarity, however, this is not required. The variables $B_x$, $B_y$, $B_z$ denote the components of the magnetic flux in the $x_t$, $y_t$, $z_t$ coordinate system. The flux components, in instances where $x_t$, $y_t$, $z_t$ do not coincide with the global coordinate system, are obtained from the flux components measured at the detector by transformations that account for detector yaw, roll, pitch, and also transmitter yaw and pitch. Dipole equations 10–13 can be applied for each transmitter position resulting in a set of 6 equations.

Equations based on measured extension of drill string 28 for the boring tool at point b may be written as:

$$x_b = \cos \phi_{av} \cos \beta_{av} \Delta l \tag{14}$$

$$y_b = \cos \phi_{av} \sin \beta_{av} \Delta l \tag{15}$$

$$z_b = \sin \phi_{av} \Delta l \tag{16}$$

where $\phi_{av}$ represents average pitch and $\beta_{av}$ represents average yaw. The average pitch and yaw angles of the transmitter are used to improve accuracy and are given by:

$$\phi_{av} = \tfrac{1}{2}(\phi_a + \phi_b) \tag{17}$$

$$\beta_{av} = \tfrac{1}{2}(\beta_a + \beta_b) \tag{18}$$

where $\phi_a$ and $\phi_b$ are measured values of pitch while $\beta_a$ and $\beta_b$ are the values of yaw at points a and b, respectively. Several standard numerical solution methods are available to solve for the unknown variables. If solved for nine unknowns, the problem is deterministic since nine equations are available. In this case, many developers use the method of Newton or function iteration. A least square solution method is preferred if solving for fewer than nine unknowns. In either instance, all parameters and locations regarding the boring tool and detector A are known with the completion of calculations such that drilling may proceed as the boring tool is tracked in its underground progress using system 300 in accordance with the teachings of the parent of the present application.

Having described various techniques for determining drilling configurations with regard to initial positional relationships and with regard to extended drill runs, attention is now directed to a highly advantageous selected flux pathline steering procedure performed in accordance with the present invention as will be described in detail accompanied by various figures. The procedure employs a single above ground detector for the measurement of three flux components induced by a transmitter inside a boring tool. The detector includes a three-axis antenna cluster/array which can form part of a stationary detector or which can form part of a walkover locator. The procedure, as described, allows left/right as well as up/down steering of the boring tool which may be performed simultaneously. In this regard, the disclosed selected flux pathline method is substantially different and highly advantageous as compared with conventional homing as described, for example, in U.S. Pat. No. 4,881,083, at least for the reason that the present invention allows steering to a target point which is not at the receiving antenna cluster location. Furthermore, the method provides for prescribing a pitch angle other than the one associated with the antenna installation.

Figure 8:
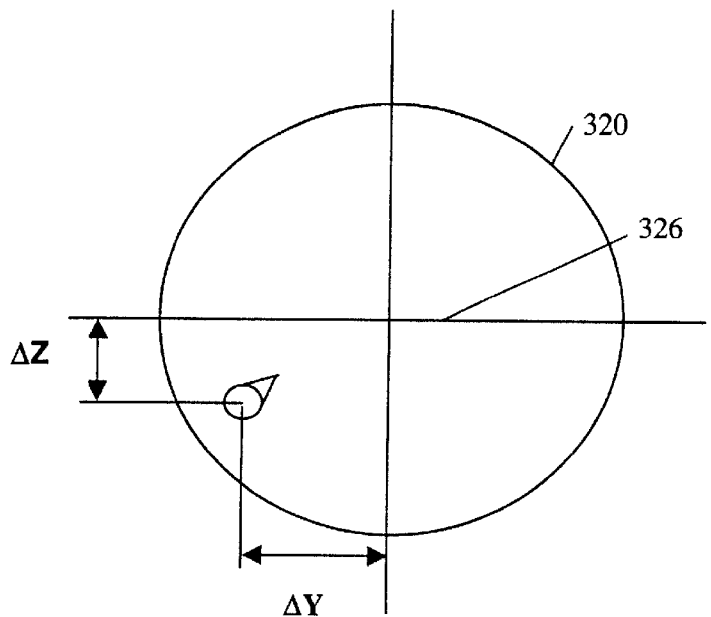
FIG. 8 is a diagrammatic representation of a display for use in the selected flux pathline steering method of the present invention.

Turning now to FIG. 8, steering commands may be displayed on an instrumentation panel 320 at an appropriate above ground location such as, for example, at the drill rig or on a portable locator configured for remotely guiding the boring tool (see copending U.S. application Ser. No. 09/066,964, filed Apr. 27, 1998 entitled Boring Tool Using Remote Locator). In the present example, the boring tool should be steered up and to the right by the operator of the system in accordance with a steering indicator 322. That is, a pointer 324 on the steering indicator shows the direction in which the boring tool should be directed to return to a path that is established in a way which will be described below. The position of the steering indicator on the display is to be established by determined values of ΔY and ΔZ. When steering indicator 322 is centered on cross-hairs 326, the boring tool is on course and no steering is required. The purpose of the steering method described below is to provide the values of parameters ΔY and ΔZ, as indicated in the figure. Steering commands, as reflected in FIG. 9, relating the sign of each parameter to steering direction are summarized in Table 5.

TABLE 5

| ΔY | ΔZ | Steer |
|---|---|---|
| >0 | — | Left |
| <0 | — | Right |
| — | <0 | Up |
| — | >0 | Down |

Figure 9:
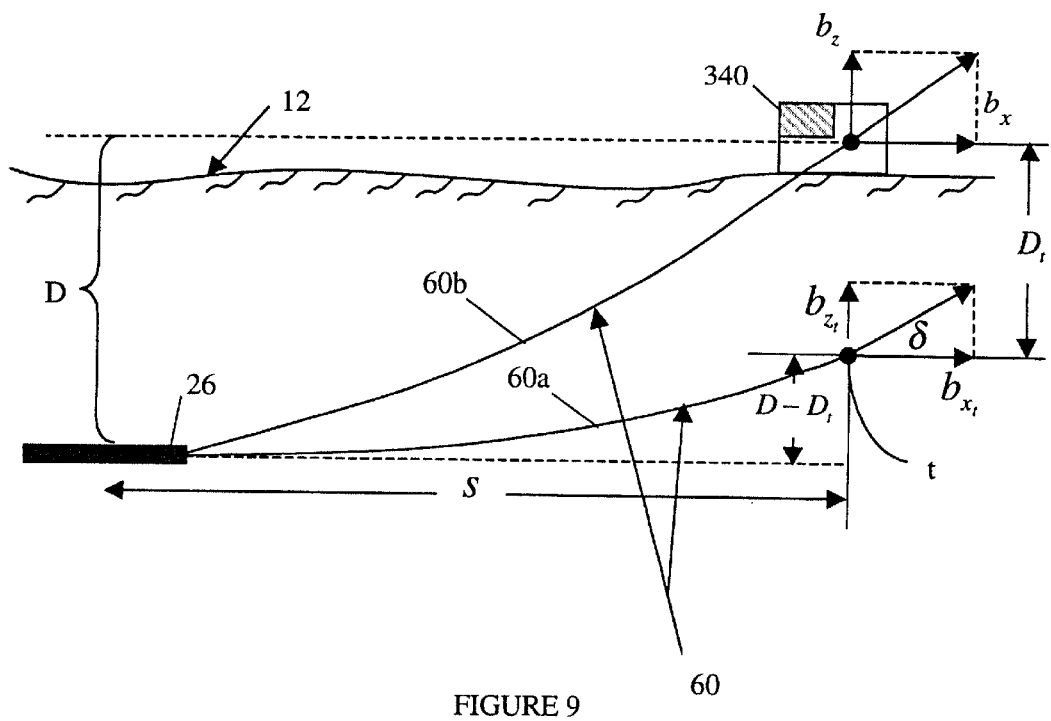
FIG. 9 is a diagrammatic view, in elevation, of a region of ground shown here to illustrate the selected flux pathline steering method of the present invention.

Referring to FIG. 9, for purposes of clarity, a discussion will first be provided with regard to up/down steering and, thereafter, a separate discussion of left/right steering will be provided. It should be appreciated, however, that during operation of the system the up/down and left/right steering features operate simultaneously. Boring tool 26 is diagrammatically shown in region 12 including its locating field transmitter which transmits locating field 60 including flux lines 60a and 60b. An above ground detector 340 includes a three axis orthogonal antenna array (not shown). Detector 340 may comprise a portable walk-over detector/locator or a fixed position detector. Now considering up/down steering, boring tool 26 can either be steered to the center of the antenna array within detector 340 or to a target location t below the antenna array. The desired transmitter pitch at the target location may be specified and may be non-zero. FIG. 9 illustrates steering towards target location t, approached at a pitch angle δ, at a depth $D_t$ below detector 340. Note that flux line 60a extends from the boring tool transmitter to target location t and flux line 60b extends from the boring tool transmitter to the antenna array in detector 340. Thus, flux line 60a represents the desired path or "pathline" of the boring tool transmitter towards the target. In essence, specifying a pitch value at the target location serves to select a flux line having that pitch as the target pathline. Therefore, the overall method is referred to as "selected flux pathline" steering at various points throughout this disclosure. Up and down steering commands through ΔZ must be such that the transmitter stays on this target pathline and the pitch angle or orientation of the boring tool matches the pathline slope of flux line 60a. If these two conditions are met, the ratio of the components of flux in the vertical and horizontal directions at the target location will be the same as the specified transmitter pitch slope at the target location t, i.e., $$\left(\frac{b_{z_t}}{b_{x_t}}\right)_{ideal} = \tan\delta \quad (19)$$

where $b_{z_t}$ and $b_{x_t}$ represent the flux components of locating field 60 at target point 342 along z and x axis directions, respectively, and δ is the pathline slope angle. Any deviation of the transmitter from the ideal target pathline will result in a different ratio of flux components at the target from which an up/down steering command is derived using:

$$\Delta Z = \tan\delta - \frac{b_{z_t}}{b_{x_t}} \quad (20)$$

Figure 10:
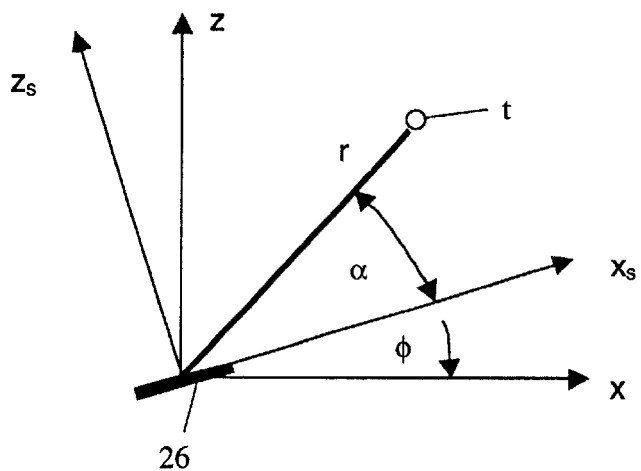
FIG. 10 is a diagrammatic illustration of the x and z coordinate axes also used in FIG. 9, shown here to illustrate the orientation of various parameters.

Referring to FIGS. 9 and 10, with the transmitter in the illustrated position, the antenna array is used to measure the components of magnetic flux b, and b, at detector 340 since an in-ground measurement at the target location is not generally possible. Hence, the measured fluxes at the detector must be converted to the flux components $b_{x_t}$, $b_{z_t}$ at the target location. The conversion is accomplished by first calculating transmitter depth D and horizontal distance s from the antenna cluster to the transmitter using equations 21–26, as follows:

$$D = r\sin(\alpha + \phi) \quad (21)$$

$$s = r\cos(\alpha + \phi) \quad (22)$$

$$b_{x_s} = b_x \cos\phi + b_z \sin\phi \text{tm} \quad (23)$$

$$b_{z_s} = -b_x \sin\phi + b_z \cos\phi \quad (24)$$

$$\frac{1}{r^3} = -\frac{b_{x_s}}{4} + \sqrt{\frac{9}{16}b_{x_s}^2 + \frac{1}{2}b_{z_s}^2} \quad (25)$$

$$\tan\alpha = \frac{b_{z_s}}{\frac{1}{r^3} + b_{x_s}} \quad (26)$$

Equations 21 through 26 are based on the known magnetic dipole equations. $b_{x_s}$ and $b_{z_s}$ are defined by equations 23 and 24. FIG. 10 illustrates the variables φ, α and r in relation to the x and z axes of the overall coordinate system. A second step in deriving the target flux components $b_{x_t}$ and $b_{z_t}$ from the measured fluxes $b_x$, $b_z$ involves the calculation of fluxes induced by the transmitter at a distance $D - D_t$ (FIG. 9) above the transmitter. The horizontal distance between target and transmitter, s, is unchanged. Hence, the target position in terms of $x_s$ and $z_s$, where $x_s$ is along the axis of the boring tool transmitter and $z_s$ is perpendicular thereto, becomes:

$$x_s = (D-D_t)\sin\phi + s\cos\phi \quad (27)$$

$$z_s = (D-D_t)\cos\phi - s\sin\phi \quad (28)$$

Application of the equations of a magnetic dipole provides the desired flux components at the target using equations 29–33:

$$b_{x_s} = \frac{3x_s^2 - r_s^2}{r_s^5} \quad (29)$$

$$b_{z_s} = \frac{3x_s z_s}{r_s^5} \quad (30)$$

$$r^2 = s^2 + (D-D_t)^2 \quad (31)$$

$$b_{x_t} = b_{x_s}\cos\phi - b_{z_s}\sin\phi \quad (32)$$

$$b_{z_t} = b_{x_s}\sin\phi + b_{z_s}\cos\phi \quad (33)$$

where r is defined in terms of s and depth per equation 31. Once ΔZ has been obtained, it may be used in the formulation of the display of FIG. 8. It should be understood that detector 340 is not required to be level in order to obtain the flux components $b_x$, $b_y$, $b_z$. Instead, gravitational angles of the locator may be recorded together with three "off coordinate axis" flux components. The angles and off coordinate axis measured values are then transformed to obtain $b_x$, $b_y$, $b_z$ using the measured angular orientation of the locator with respect to the ground surface.

It should be appreciated that the aforedescribed transformation of flux components is not required if the transmitter is steered towards the detector (i.e., where the target is the detector). However, transmitter pitch at the target can still be specified so that the steering command may be written as:

$$\Delta Z = \tan\delta - \frac{b_z}{b_x} \quad (33)$$

Referring to FIG. 9, with regard to left/right steering, the x axis antenna of the antenna array (not shown) within detector 340 is oriented pointing in the direction of the desired drill path. Hence, the desired azimuth angle is zero and steering is accomplished by forcing the component of magnetic flux by normal to the desired drill path to vanish. In view of this, the steering command for ΔY then becomes:

$$\Delta Y = \frac{b_y}{b_x} \quad (34)$$

However, it should be appreciated that left and right steering can be modified to allow the specification of an arbitrary azimuth angle.

It should be mentioned that the described procedure allows effective steering over both long and short distances. Maximum steering range is primarily limited by transmitter signal strength and environmental noise. The required minimum distance between locator and transmitter depends on how well transmitter position and angular orientation match the ideal drill pathline and its slope. Steering effectiveness at close range may also be limited by the physical characteristics of the drill pipe and soil conditions.

Figure 11:
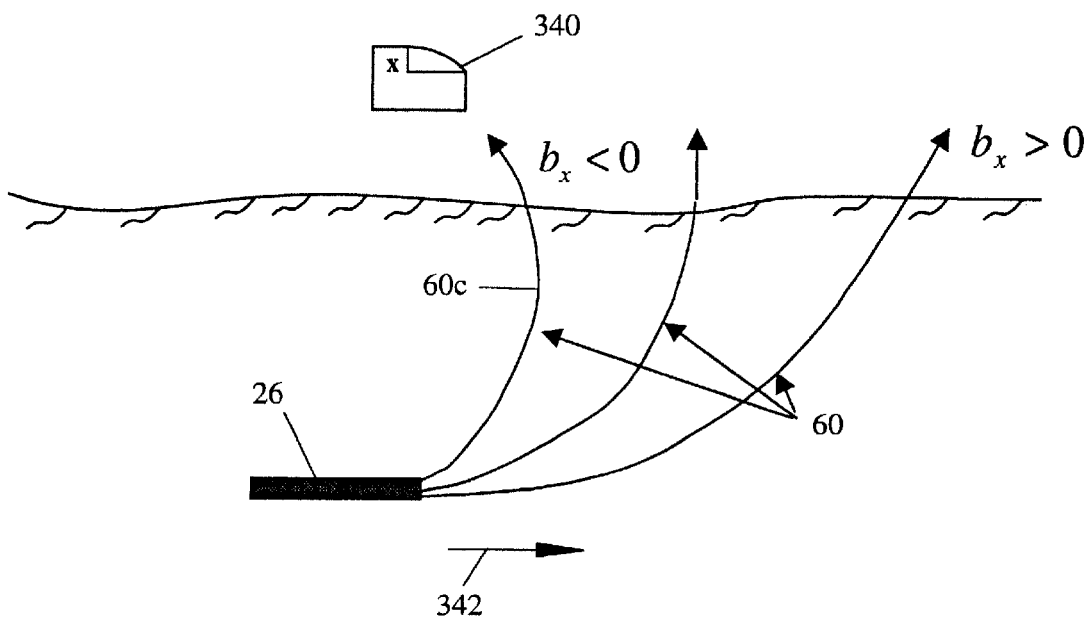
FIG. 11 is a diagrammatic plan view of a horizontal boring operation being performed in which the boring tool passes beneath an above ground locator, shown here to illustrate reversal of the locating field flux lines.

Referring to FIG. 11, boring tool transmitter 26 is shown passing beneath detector 340 in the direction given by an arrow 342. In such short range situations where the target is below the detector, it should be appreciated that the flux lines of locating field 60 will reverse in direction as illustrated by a flux line 60c. Steering towards any target on or below the antenna array/detector is possible even though the flux lines recorded by the locator reverse direction. Further in this regard, it should be appreciated that the sign of flux components cannot be readily measured. Only their absolute values and the sign of their ratios are normally available. Therefore any practical steering technique requires sign conventions in addition to the approach described above. One method of determining the signs of $b_x$, $b_y$, $b_z$ assumes $b_z$ to be positive and the signs of be and by to be given by the signs of $b_x/b_z$ and by $b_y/b_x$ respectively. Note that the sign of $b_x/b_z$ changes when the direction in which the locator/detector points is reversed. Hence, during steering, the locator/detector should always point in the same direction. Moreover, a boring tool transmitter can only be steered to the locator or a target directly underneath but cannot be steered along a desired path beyond the target. As mentioned above, flux lines from the transmitter to the target having the prescribed pitch slope at the target are desired pathlines. These flux lines converge approaching the target but diverge leaving the target. Hence, steering is a stable process ahead of the target but becomes unstable behind the target where the flux lines diverge. While the above method calls for a three axis receiver, the procedure may also be employed using a two axis receiver (not shown) where the target point is substantially in the plane defined by the orthogonal antennas and the drill path is substantially in the same plane.

Inasmuch as the systems and associated methods disclosed herein may be provided in a variety of different configurations, it should be understood that the present invention may be embodied in many other specific forms and the methods may be practiced in many different ways without departing from the spirit of scope of the invention. Therefore, the present examples and methods are to be considered as illustrative and not restrictive, and the invention is not to be limited to the details given herein, but may be modified within the scope of the appended claims.

What is claimed is:

1. In a system in which a boring tool is moved through the ground in a region, an improvement forming part of an arrangement for tracking the position and/or guiding the boring tool using an electromagnetic locating signal which is transmitted from the boring tool as the boring tool moves through the ground, the improvement
   at least two detectors located at fixed positions within said region, each being operable in a transmit mode and in a receive mode such that each one of said detectors in the transmit mode is able to transmit a relative locating signal to the other detector for use in determining the relative position of one detector in relation to the other and such that both detectors receive the electromagnetic locating signal in the receive mode for use in determining the position of the boring tool within said region.

2. The improvement according to claim 1 wherein each detector includes one antenna array for receiving said electromagnetic locating signals and for receiving said relative locating signal.

3. The improvement according to claim 2 wherein each detector is configured for transmitting said relative locating signal from said antenna array when the detector is in said transmit mode.

4. The improvement according to claim 3 wherein the antenna array of each detector includes three antennas arranged along three orthogonal axes.

5. The improvement according to claim 4 wherein the relative locating signal is alternately transmitted from each one of the three orthogonally arranged antennas for receipt by one or more other detectors.

6. The improvement of claim 1 wherein said detectors receive said electromagnetic locating signal in a predetermined way to produce electromagnetic data in the receive mode and wherein said arrangement includes processing means for using certain information including the electromagnetic data and the relative position established between the detectors to determine the absolute positions of the boring tool and the detectors within said region.

7. The improvement of claim 6 wherein said detectors include tilt sensors for measuring the tilt angles of each detector in its fixed position such that the tilt angles of each detector form part of said certain information.

8. The improvement of claim 6 wherein said region includes a cartesian coordinate system having orthogonal x, y and z axes and wherein said processing means is configured for using a distance of one of the detectors from a predetermined one of said axes as part of said certain information.

9. The improvement of claim 6 wherein said arrangement is configured for receiving said electromagnetic locating signal in said predetermined way by initially using the detectors to receive the electromagnetic locating signal with said boring tool at a first position to produce a first subset of said electromagnetic data and then using the detectors to receive the electromagnetic locating signal with said boring tool at a second position to produce a second subset of said electromagnetic data and, thereafter, said processing means is configured for combining the first and second subsets of electromagnetic data to produce the overall electromagnetic data for use, along with the established relative position between the detectors, in determining the absolute positions of the detectors in said region.

10. The improvement of claim 6 wherein said system includes a drill rig having an extendable drill string attached to said boring tool such that movement of the boring tool is accomplished by extending or retracting the drill string and the system also includes measurement means for measuring movement of the boring tool based on retraction and extension of said drill string and wherein said arrangement is configured for receiving said electromagnetic locating signal in said predetermined way by initially using the detectors to receive the electromagnetic locating signal with said boring tool at a first position to produce a first subset of said electromagnetic data and then using the detectors to receive the electromagnetic locating signal with said boring tool at a second position to produce a second subset of said electromagnetic data, said first and second positions being separated by a measured distance as determined by said measurement means, and said processing means further being configured for combining the first and second subsets of electromagnetic data to produce the overall electromagnetic data for use, along with the established relative position between the detectors and said certain information, including said measured distance, in determining the absolute positions of the detectors in said region.

11. The improvement of claim 10 further configured for producing one or more additional subsets of said electromagnetic data at one or more additional positions of said boring tool, said additional subsets of electromagnetic data, thereafter, being used as part of the overall electromagnetic data in a way which improves accuracy in determining the absolute positions of the detectors in said region.

12. The improvement of claim 1 wherein said detectors are able to receive said electromagnetic signal in said receive mode within a dipole range from said boring tool and are able to receive said relative locating signal within a relative range from a detector that is in said transmit mode and wherein at least one additional detector is positioned in said region such that the additional detector may be out of said dipole range from the boring tool, but is within said relative range of at least a first specific one of the other detectors, the absolute position of which is known in said region, such that with one of either the first specific detector or the additional detector in transmit mode and the other one of either the additional detector or the first specific detector receiving the relative locating signal, the relative position of the additional detector is determinable in relation to the known position of the first specific detector so that, in conjunction with the known position of the first specific detector, the absolute position of the additional receiver is established within said region.

13. The improvement of claim 12 wherein the additional detector is used in transmit mode and wherein at least said first specific detector and a second specific one of the other detectors are within relative range of the additional detector such that the absolute position of said additional detector in said region is determinable based on the relative signal received by the first and second specific detectors.

14. The improvement of claim 12 wherein said first specific detector is the farthest detector from said boring tool.

15. The improvement of claim 12 wherein said first specific detector is used in said transmit mode and the additional receiver receives the relative locating signal.

16. In a system in which a boring tool is moved through the ground in a region, an improvement forming part of an arrangement for tracking the position and/or guiding the boring tool as it moves through the ground using an electromagnetic locating signal which is transmitted from the boring tool, the improvement comprising:

a) a transceiver detector located at one fixed position within said region and configured for transmitting a relative locating signal in a setup mode and for receiving the electromagnetic locating signal in a tracking mode for use in establishing the position of the boring tool; and b) at least one receiver detector at another fixed position within said region configured for receiving said relative locating signal in said setup mode such that the position of the receiver detector can be established relative to the position of the transceiver detector, based on the relative locating signal and for receiving the electromagnetic locating signal in said tracking mode for use in establishing the position of the boring tool.

17. The improvement according to claim 16 wherein said transceiver detector includes an antenna array for receiving said electromagnetic locating signal and for transmitting said relative locating signal using said antenna array when the transceiver detector is in said setup mode.

18. The improvement according to claim 17 wherein the antenna array of said transceiver detector includes three antennas arranged along three orthogonal axes.

19. The improvement according to claim 18 wherein the relative locating signal is alternately transmitted from each one of the three orthogonally arranged antennas for receipt by one or more other detectors.

20. The improvement of claim 16 wherein said transceiver detector and said receiver detector are configured for receiving said electromagnetic locating signal in a predetermined way to produce electromagnetic data in said setup mode and wherein said arrangement includes means for using certain information including the electromagnetic data in conjunction with the relative position established between the detectors to determine the absolute positions of the boring tool, the receiver detector and the transceiver detector within said region.

21. The improvement of claim 20 wherein said transceiver detector and said receiver detector each include a tilt sensor for measuring the tilt angles of the transceiver detector and receiver detector such that the tilt angles form part of said certain information.

22. The improvement of claim 20 wherein said arrangement is configured for receiving said electromagnetic locating signal in said predetermined way by initially using the transceiver and receiver detectors to receive the electromagnetic locating signal with said boring tool at a first position to produce a first subset of said electromagnetic data and then using the transceiver and receiver detectors to receive the electromagnetic locating signal with said boring tool at a second position to produce a second subset of said electromagnetic data and said processing means further being configured for combining the first and second subsets of electromagnetic data to produce the overall electromagnetic data for use, along with the established relative position between the transceiver and receiver detectors, in determining the absolute positions of the transceiver and receiver detectors in said region without the need for said certain information.

23. The improvement of claim 20 wherein said system includes a drill rig having an extendable drill string attached to said boring tool such that movement of the boring tool is accomplished by extending or retracting the drill string and the system also includes measurement means for measuring movement of the boring tool based on retraction and extension of said drill string and wherein said arrangement is configured for receiving said electromagnetic locating signal in said predetermined way by initially using the transceiver and receiver detectors to receive the electromagnetic locating signal with said boring tool at a first position to produce a first subset of said electromagnetic data and then using the transceiver and receiver detectors to receive the electromagnetic locating signal with said boring tool at a second position to produce a second subset of said electromagnetic data, said first and second positions being separated by a measured distance as determined by said measurement means, and, thereafter, said processing means being configured for combining the first and second subsets of electromagnetic data to produce the overall electromagnetic data for use, along with the established relative position between the detectors and said certain information, including said measured distance, in determining the absolute positions of the transceiver and receiver detectors in said region.

24. The improvement of claim 23 further configured for producing one or more additional subsets of said electromagnetic data at one or more additional positions of said boring tool, said additional subsets of electromagnetic data, thereafter, being used as part of the overall electromagnetic data in a way which improves accuracy in determining the absolute positions of the transceiver and receiver detectors in said region.

\* \* \* \* \*